(12) United States Patent
Orihashi et al.

(10) Patent No.: US 11,164,744 B2
(45) Date of Patent: Nov. 2, 2021

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Yugo Orihashi, Toyama (JP); Atsushi Moriya, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/284,771

(22) Filed: Feb. 25, 2019

(65) Prior Publication Data
US 2019/0189440 A1 Jun. 20, 2019

Related U.S. Application Data

(63) Continuation of application No. 15/463,085, filed on Mar. 20, 2017, now Pat. No. 10,262,857.

(30) Foreign Application Priority Data

Apr. 7, 2016 (JP) .................................. 2016-077214

(51) Int. Cl.
*H01L 21/02* (2006.01)
*C23C 16/24* (2006.01)
(Continued)

(52) U.S. Cl.
CPC ........ *H01L 21/02532* (2013.01); *C23C 16/24* (2013.01); *C23C 16/401* (2013.01);
(Continued)

(58) Field of Classification Search
CPC ..... C23C 16/24; C23C 16/401; C23C 16/455; C23C 16/45546; C23C 16/45557; C23C 16/52; H01L 21/02532; H01L 21/0262
See application file for complete search history.

(56) References Cited

U.S. PATENT DOCUMENTS 6,083,413 A * 7/2000 Sawin .................. B08B 7/0057
216/104
8,808,452 B2 * 8/2014 Noro ....................... C30B 25/08
117/97
(Continued)

FOREIGN PATENT DOCUMENTS

CN 103165410 A 6/2013
JP 2013-197307 A 9/2013
(Continued)

OTHER PUBLICATIONS

Chinese Office Action dated Dec. 31, 2019 for the Chinese Patent Application No. 201710166926.1.

*Primary Examiner* — Mohammed Shamsuzzaman
(74) *Attorney, Agent, or Firm* — Volpe Koenig

(57) ABSTRACT

There is provided a method of manufacturing a semiconductor device, comprising forming a film on a substrate in a process chamber by performing a cycle a predetermined number of times. The cycle includes alternately performing supplying a halogen-based first process gas to the substrate in the process chamber, and supplying a non-halogen-based second process gas to the substrate in the process chamber. Further, an internal pressure of the process chamber in the act of supplying the first process gas is set to be higher than an internal pressure of the process chamber in the act of supplying the second process gas.

18 Claims, 9 Drawing Sheets

(51) Int. Cl.
  *C23C 16/40* (2006.01)
  *C23C 16/455* (2006.01)
  *C23C 16/52* (2006.01)

(52) U.S. Cl.
  CPC ...... *C23C 16/455* (2013.01); *C23C 16/45546* (2013.01); *C23C 16/45557* (2013.01); *C23C 16/52* (2013.01); *H01L 21/0262* (2013.01)

(56) References Cited

U.S. PATENT DOCUMENTS

| | | | | |
|---|---|---|---|---|
| 8,945,339 | B2* | 2/2015 | Kakimoto | H01L 21/02639 156/345.24 |
| 9,269,566 | B2* | 2/2016 | Akae | C23C 16/45512 |
| 9,463,998 | B2* | 10/2016 | Saitoh | C23C 16/545 |
| 9,997,354 | B2* | 6/2018 | Orihashi | H01L 21/02381 |
| 10,081,868 | B2* | 9/2018 | Takagi | C23C 16/455 |
| 10,607,833 | B2* | 3/2020 | Harada | H01L 21/02164 |
| 2002/0022347 | A1* | 2/2002 | Park | H01L 21/02576 438/478 |
| 2006/0288935 | A1* | 12/2006 | Kato | C23C 16/24 118/715 |
| 2012/0220137 | A1* | 8/2012 | Ota | H01L 21/02219 438/765 |
| 2013/0149846 | A1 | 6/2013 | Koshi et al. | |
| 2013/0149872 | A1 | 6/2013 | Hirose et al. | |
| 2013/0171838 | A1* | 7/2013 | Okuda | H01L 21/228 438/778 |
| 2013/0273747 | A1* | 10/2013 | Sano | C23C 16/45553 438/778 |
| 2014/0051261 | A1* | 2/2014 | Ota | C23C 16/45523 438/770 |
| 2014/0179085 | A1* | 6/2014 | Hirose | C23C 16/45544 438/478 |
| 2014/0287597 | A1* | 9/2014 | Hirose | H01L 21/0217 438/786 |
| 2014/0357058 | A1* | 12/2014 | Takagi | C23C 16/45534 438/478 |
| 2016/0141173 | A1* | 5/2016 | Moriya | C30B 25/20 438/479 |
| 2016/0293398 | A1* | 10/2016 | Danek | C23C 16/45527 |
| 2016/0300715 | A1* | 10/2016 | Dube | H01L 21/0262 |

FOREIGN PATENT DOCUMENTS

| | | |
|---|---|---|
| JP | 2014-067796 A | 4/2014 |
| WO | 2012/029661 A1 | 3/2012 |

\* cited by examiner

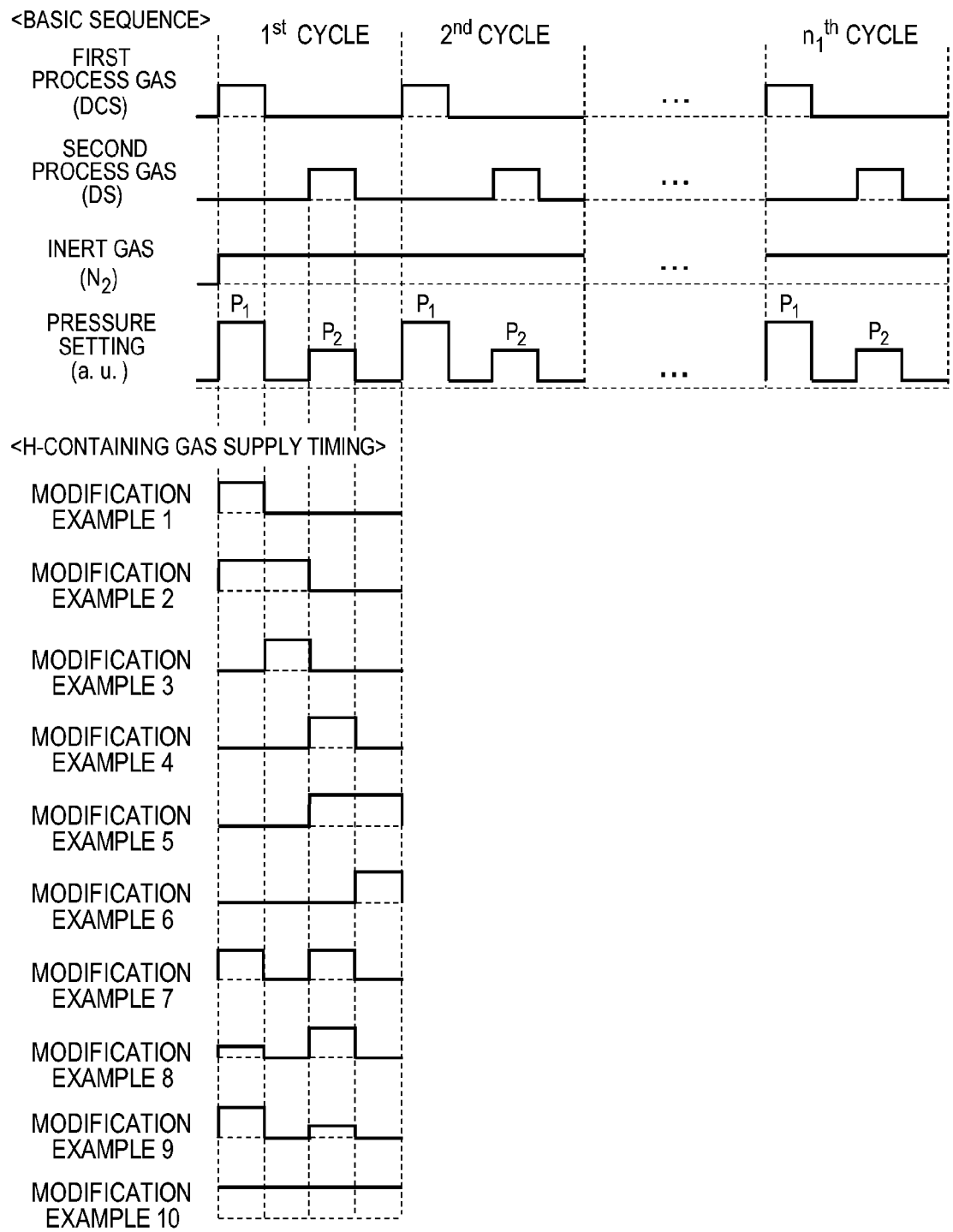

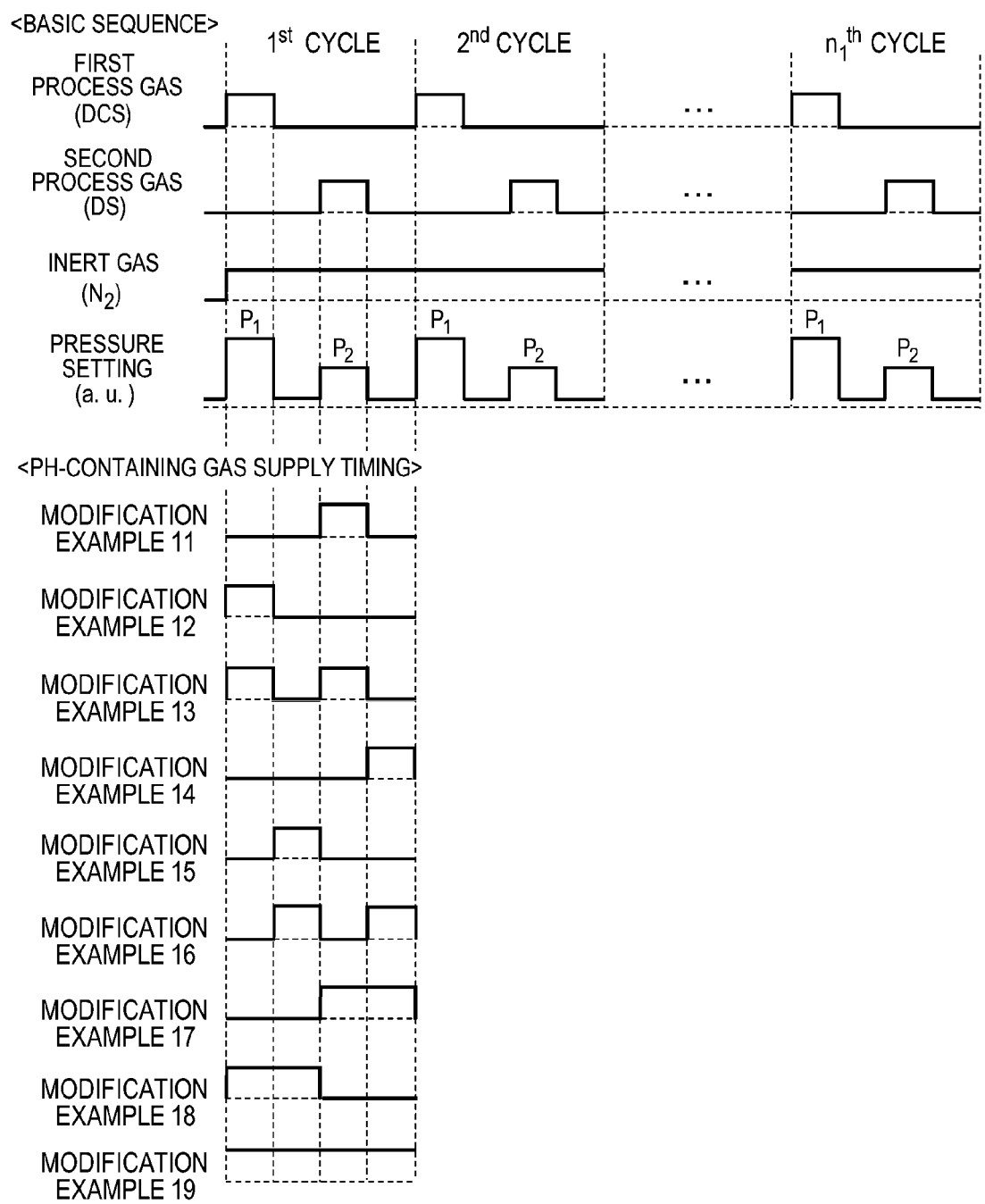

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is a continuation of U.S. patent application Ser. No. 15/463,085, filed Mar. 20, 2017, which is based upon and claims the benefit of priority from Japanese Patent Application No. 2016-077214, filed on Apr. 7, 2016, the entire contents of which are incorporated herein by reference.

TECHNICAL FIELD

The present disclosure relates to a method of manufacturing a semiconductor device, a substrate processing apparatus, and a recording medium.

BACKGROUND

As an example of processes for manufacturing a semiconductor device, a film formation process for forming, on a substrate, a film containing a predetermined element such as silicon (Si) or the like as a main element is often performed by using a halogen-based process gas or a non-halogen-based process gas.

SUMMARY

The present disclosure provides some embodiments of a technique capable of improving a film quality of a film formed on a substrate.

According to one embodiment of the present disclosure, there is provided a technique of manufacturing a semiconductor device, comprising forming a film on a substrate in a process chamber by performing a cycle a predetermined number of times, the cycle including alternately performing supplying a halogen-based first process gas to the substrate in the process chamber, and supplying a non-halogen-based second process gas to the substrate in the process chamber, wherein an internal pressure of the process chamber in the act of supplying the first process gas is set to be higher than an internal pressure of the process chamber in the act of supplying the second process gas.

BRIEF DESCRIPTION OF THE DRAWINGS

FIG. 4 illustrates a film forming sequence according to one embodiment of the present disclosure and modification examples thereof.

FIG. 5 illustrates the film forming sequence according to one embodiment of the present disclosure and other modification examples thereof.

DETAILED DESCRIPTION

One Embodiment of the Present Disclosure

One embodiment of the present disclosure is described below with reference to FIGS. 1 to 3.

(1) Configuration of Substrate Processing Apparatus

Figure 1:
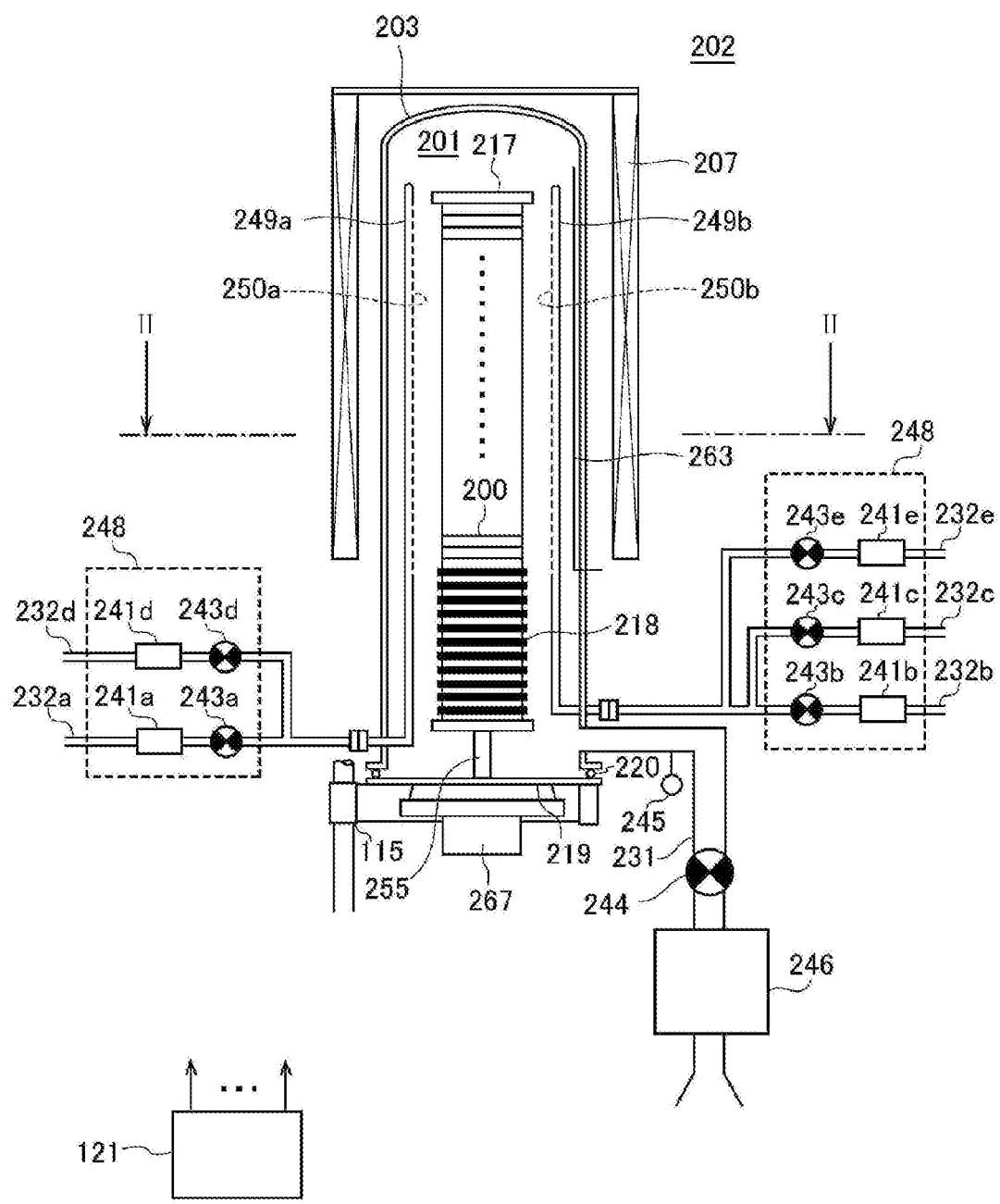
FIG. 1 schematically illustrates a configuration of a vertical processing furnace of a substrate processing apparatus suitably employed in one embodiment of the present disclosure, in which a portion of the processing furnace is shown in a vertical cross-sectional view.

As illustrated in FIG. 1, a processing furnace 202 includes a heater 207 as a heating means (heating mechanism). The heater 207 is of a cylindrical shape and is supported by a retaining plate so as to be vertically installed. The heater 207 functions as an activation mechanism (excitation part) configured to thermally activate (or excite) gas.

A reaction tube 203 that defines a reaction vessel (process vessel) is installed inside the heater 207 to be concentric with the heater 207. The reaction tube 203 is made, for example, of a heat resistant material such as quartz ($SiO_2$), silicon carbide (SiC), or the like, and is formed in a cylindrical shape with its upper end closed and its lower end opened. A process chamber 201 is formed in a hollow cylindrical portion of the reaction tube 203. The process chamber 201 is configured to be capable of accommodating wafers 200 as substrates.

Nozzles 249a and 249b penetrate a lower side wall of the reaction tube 203 and are installed in the process chamber 201. The nozzles 249a and 249b are made, for example, of a heat resistant material such as quartz or SiC. Gas supply pipes 232a and 232b are connected to the nozzles 249a and 249b, respectively. A gas supply pipe 232c is connected to the gas supply pipe 232b.

Mass flow controllers (MFCs) 241a to 241c as flow rate controllers (flow rate control parts) and valves 243a to 243c as opening/closing valves are installed to the gas supply pipes 232a to 232c, respectively, sequentially from upstream sides of the gas supply pipes 232a to 232c. Gas supply pipes 232d and 232e for supplying inert gas are connected to the gas supply pipes 232a and 232b, respectively, at downstream sides of the valves 243a and 243b. MFCs 241d and 241e and valves 243d and 243e are installed to the gas supply pipes 232d and 232e, respectively, sequentially from upstream sides of the gas supply pipes 232d and 232e.

Figure 2:
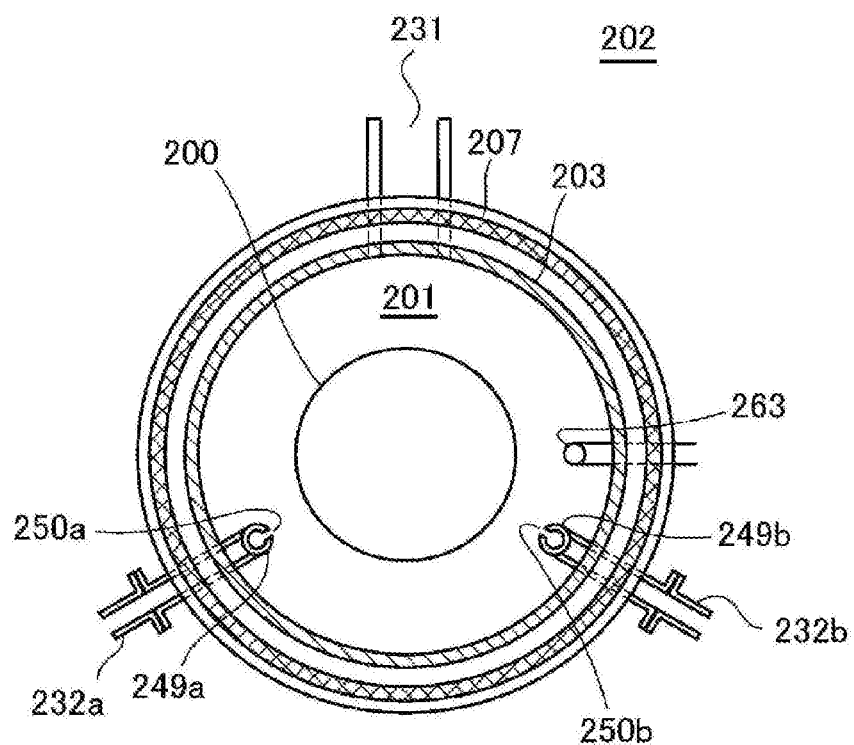
FIG. 2 schematically illustrates a configuration of the vertical processing furnace of the substrate processing apparatus suitably employed in one embodiment of the present disclosure, in which a portion of the processing furnace is shown in a cross-sectional view taken along a line II-II in FIG. 1.

As shown in FIG. 2, the nozzles 249a and 249b are installed in an annular-shaped space in a plan view, between an inner wall of the reaction tube 203 and the wafers 200 such that the nozzles 249a and 249b extend upward along a stacked direction of the wafers 200 from a lower portion to an upper portion of the inner wall of the reaction tube 203. Specifically, each of the nozzles 249a and 249b is installed to extend along a wafer arrangement region where the wafers 200 are arranged, in a region that horizontally surrounds the wafer arrangement region at a lateral side of the wafer arrangement region. Gas supply holes 250a and 250b for supplying gas are formed on side surfaces of the nozzles 249a and 249b, respectively. Each of the gas supply holes 250a and 250b is opened to face the center of the reaction tube 20 and capable of supplying gas toward the wafers 200. A plurality of gas supply holes 250a and 250b is formed between a lower portion and an upper portion of the reaction tube 203.

A gas containing Si as a predetermined element (main element) and a halogen element, namely a halosilane precursor gas, which serves as a halogen-based first process gas, is supplied from the gas supply pipe 232a into the process chamber 201 via the MFC 241a, the valve 243a, and the nozzle 249a.

The precursor gas refers to a gas staying in a gaseous state, for example, a gas obtained by vaporizing a precursor staying in a liquid state under room temperature and atmospheric pressure, a precursor staying in a gaseous state under room temperature and atmospheric pressure, or the like. Halosilane refers to a silane having a halogen group. The halogen group includes a chloro group, a fluoro group, a bromo group, an iodine group, and the like. As such, the halogen group includes a halogen element such as chlorine (Cl), fluorine (F), bromine (Br), iodine (I), and the like.

For example, a halosilane precursor gas containing Si and Cl, namely a chlorosilane precursor gas, may be used as the first process gas. For instance, a dichlorosilane ($SiH_2Cl_2$, abbreviation: DCS) gas may be used as the chlorosilane precursor gas.

A halogen-element-free silane precursor gas containing Si as a predetermined element (main element), which serves as a non-halogen-based second process gas, is supplied from the gas supply pipe 232b into the process chamber 201 via the MFC 241b, the valve 243b, and the nozzle 249b. A silicon hydride precursor gas may be used as the second process gas. For example, disilane ($Si_2H_6$, abbreviation: DS) gas may be used.

An inert gas, for example, nitrogen ($N_2$) gas, is supplied from the gas supply pipes 232d and 232e into the process chamber 201, respectively, via the MFCs 241d and 241e, the valves 243d and 243e, the gas supply pipes 232a and 232b, and the nozzles 249a and 249b.

A first supply system configured to supply the first process gas mainly includes the gas supply pipe 232a, the MFC 241a, and the valve 243a. A second supply system configured to supply the second process gas mainly includes the gas supply pipe 232b, the MFC 241b, and the valve 243b. An inert gas supply system mainly includes the gas supply pipes 232d and 232e, the MFCs 241d and 241e, and the valves 243d and 243e.

One or all of the above-described various supply systems may be configured as an integrated supply system 248 in which the valves 243a to 243e, the MFCs 241a to 241e, and the like are integrated. The integrated supply system 248 is connected to the respective gas supply pipes 232a to 232e and is configured so that the operations of supplying various gases into the gas supply pipes 232a to 232e, namely opening and closing operations of the valves 243a to 243e, flow rate adjustment operations of the MFCs 241a to 241e, and the like, are controlled by a controller 121 which is described below. The integrated supply system 248 is configured as an integral integrated unit or split integrated units, and may be attached to or detached from the gas supply pipes 232a to 232e or the like on an integrated unit basis. The integrated supply system 248 is configured such that the maintenance, the replacement, and the expansion of a supply system can be performed on an integrated unit basis.

An exhaust pipe 231 for exhausting an atmosphere in the process chamber 201 is installed to the reaction tube 203. A vacuum pump 246 as a vacuum exhaust device is connected to the exhaust pipe 231 via a pressure sensor 245 as a pressure detector (pressure detection part) for detecting an internal pressure of the process chamber 201 and an APC (Auto Pressure Controller) valve 244 as a pressure regulator (pressure regulation part). The APC valve 244 is configured to be opened or closed, while the vacuum pump 246 operates, in order to vacuum-exhaust an interior of the process chamber 201 or stop the interior of the process chamber 201 from being vacuum-exhausted; and further configured to adjust its opening degree based on pressure information detected by the pressure sensor 245, while the vacuum pump 246 operates, in order to adjust the internal pressure of the process chamber 201. An exhaust system mainly includes the exhaust pipe 231, the APC valve 244, and the pressure sensor 245. The vacuum pump 246 may be included in the exhaust system.

A seal cap 219, which serves as a furnace opening lid capable of air-tightly closing a lower end opening of the reaction tube 203, is installed under the reaction tube 203. The seal cap 219 is made, for example, of metal such as stainless steel or the like is formed in a disc shape. An O-ring 220 as a seal member making contact with the lower end of the reaction tube 203 is installed on an upper surface of the seal cap 219. A rotation mechanism 267 configured to rotate a boat 217, which is described below, is installed under the seal cap 219. A rotary shaft 255 of the rotation mechanism 267 penetrates the seal cap 219 and is connected to the boat 217. The rotation mechanism 267 is configured to rotate the wafers 200 by rotating the boat 217. The seal cap 219 is configured to be moved up and down in a vertical direction by a boat elevator 115 as an elevating mechanism installed outside the reaction tube 203. The boat elevator 115 is configured as a conveying device (conveying mechanism) which loads and unloads (conveys) the boat 217, ultimately the wafers 200, into and out of the process chamber 201 by raising and lowering the seal cap 219.

The boat 217 serving as a substrate support is configured to support a plurality of wafers 200, for example, 25 to 200 wafers, in a horizontal posture and in multiple stages along the vertical direction with the centers of the wafers 200 aligned with one another, that is, to arrange the wafers 200 to be spaced apart from each other. The boat 217 is made of a heat resistant material such as quartz or SiC. Heat insulating plates 218 made, for example, of a heat resistant material such as quartz or SiC, are installed below the boat 217 in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a and 249b, the temperature sensor 263 is installed along the inner wall of the reaction tube 203.

Figure 3:
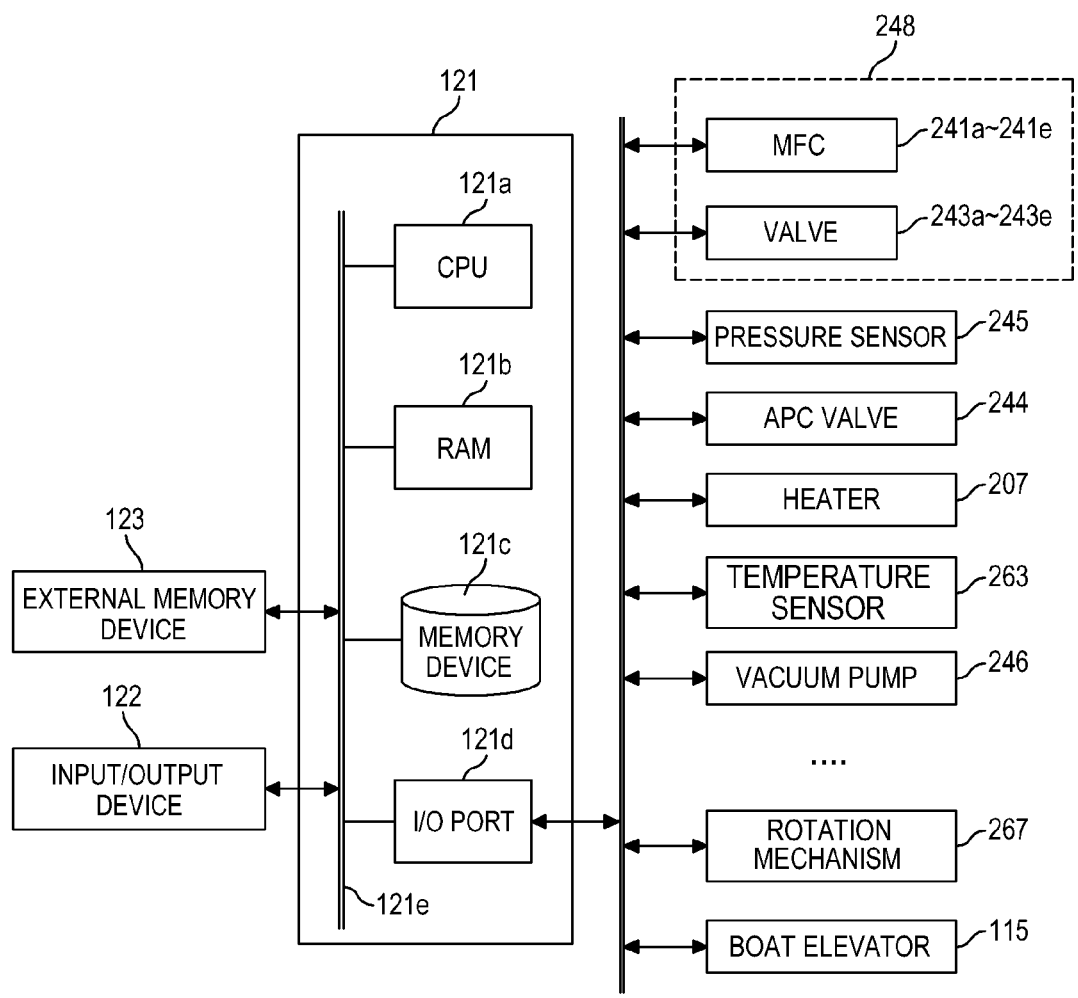
FIG. 3 schematically illustrates a configuration of a controller in the substrate processing apparatus suitably employed in one embodiment of the present disclosure, in which a control system of the controller is shown in the form of a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 including, for example, a touch panel or the like, is connected to the controller 121.

The memory device 121c is configured, for example, by a flash memory, a hard disc drive (HDD), or the like. A control program, by which operations of a substrate processing apparatus are controlled, a process recipe, in which sequences and conditions of a substrate processing procedure to be described below are described, or the like is readably stored in the memory device 121c. The process recipe functions as a program for causing the controller 121 to execute each sequence in the substrate processing procedure, as described below, to obtain a predetermined result. Hereinafter, the process recipe and the control program may be generally and simply referred to as a "program." Furthermore, the process recipe may be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the heater 207, the temperature sensor 263, the rotation mechanism 267, the boat elevator 115, and the like.

The CPU 121a is configured to read the control program from the memory device 121c and execute the control program. The CPU 121a also reads the recipe from the memory device 121c according to an input of an operation command from the input/output device 122. In addition, the CPU 121a is configured to control, according to the content of the read recipe, the flow rate adjusting operation of various kinds of gases by the MFCs 241a to 241e, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and the like.

The controller 121 may be configured by installing, on the computer, the aforementioned program stored in an external memory device 123 (for example, a magnetic disc such as a hard disc or the like, an optical disc such as a CD or the like, a magneto-optical disc such as an MO or the like, or a semiconductor memory such as a USB memory or the like).

The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using communication means such as the Internet or a dedicated line, instead of using the external memory device 123.

(2) Substrate Processing Procedure

A sequence example of forming a Si film and then forming a SiO film on the wafer 200 as a substrate using the aforementioned substrate processing apparatus, which is one of the processes for manufacturing a semiconductor device, is described below with reference to FIGS. 6A to 6H. In the following descriptions, the operations of the respective parts constituting the substrate processing apparatus are controlled by the controller 121.

In a basic sequence shown in FIG. 4, a Si film having an extremely small thickness, namely an extremely thin Si film, is formed on the wafer 200 by performing a predetermined number of times (e.g., $n_1$ times where $n_1$ is an integer equal to or greater than 1) a cycle which includes alternately performing Step 1 of supplying DCS gas as a first process gas to the wafer 200 accommodated in the process chamber 201 and Step 2 of supplying DS gas as a second process gas to the wafer 200 accommodated in the process chamber 201. In the present disclosure, the extremely thin Si film may also be simply referred to as a Si film. Furthermore, in the present disclosure, the basic sequence shown in FIG. 4 may be denoted as below for the sake of convenience. Similar notations may also be used in the following descriptions of modification examples and the like.

$$(DCS \rightarrow DS) \times n_1 \Rightarrow Si$$

After the Si film is formed on the wafer 200 by the basic sequence shown in FIG. 4, a SiO film is formed. The formation of the SiO film is not necessarily required and may be omitted.

When the term "wafer" is used herein, it may refer to a wafer itself or a laminated body of a wafer and a predetermined layer or film formed on the surface of the wafer. When the phrase "a surface of a wafer" is used herein, it may refer to a surface of a wafer itself or a surface of a predetermined layer or the like formed on a wafer. In the present disclosure, the expression "a predetermined layer is formed on a wafer" may mean that a predetermined layer is directly formed on a surface of a wafer itself or that a predetermined layer is formed on a layer or the like formed on a wafer. When the term "substrate" is used herein, it may be synonymous with the term "wafer."

(Wafer Charging and Boat Loading)

A plurality of wafers 200 is charged into the boat 217 (wafer charging). Thereafter, as shown in FIG. 1, the boat 217 supporting the plurality of wafers 200 is lifted by the boat elevator 115 and is loaded into the process chamber 201 (wafer loading). In this state, the seal cap 219 seals the lower end of the reaction tube 203 via the O-ring 220.

For example, a Si substrate formed of monocrystalline Si or a substrate having a monocrystalline Si film formed on its surface may be used as the wafer 200. On the surface of the wafer 200, monocrystalline Si is exposed. For example, an insulating film such as a silicon oxide film (SiO film), a silicon nitride film (SiN film), a silicon oxynitride film (SiON film), or the like may be formed on a portion of the surface of the wafer 200.

Figure 6A:
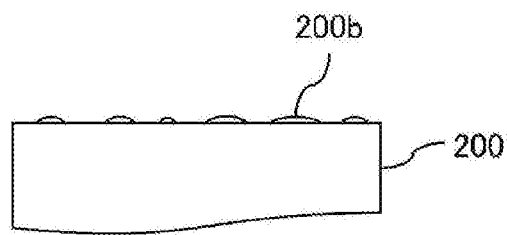
FIG. 6A illustrates a cross-sectional structure of a wafer surface before a Si film forming process is started.
Figure 6B:
FIG. 6B illustrates a cross-sectional structure of the wafer surface after DCS gas is supplied during the act of performing the Si film forming process.

FIGS. 6A to 6H are partial enlarged sectional views of a cross-sectional structure of the surface of the wafer 200. Before the wafer 200 is loaded into the process chamber 201, the surface of the wafer 200 is cleaned beforehand with hydrogen fluoride (HF) or the like. However, after the cleaning process, the surface of the wafer 200 is temporarily exposed to the atmosphere until the wafer 200 is loaded into the process chamber 201. Therefore, as shown in FIG. 6A, a natural oxide film (SiO film) 200b may be formed on at least a portion of the surface of the wafer 200 loaded into the process chamber 201. The natural oxide film 200b may be formed to sparsely (in an island shape) cover the surface of the wafer 200, namely a portion of the exposed monocrystalline crystal Si, or may be formed to continuously (in a non-island shape) cover the entire region of the exposed monocrystalline Si.

(Pressure Regulation and Temperature Adjustment)

The interior of the process chamber 201, namely the space in which the wafers 200 are located, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information. The vacuum pump 246 may be continuously activated at least until processing the wafers 200 is completed. The wafers 200 in the process chamber 201 are heated by the heater 207 to a desired film forming temperature. In this operation, the state of supplying electric power to the heater 207 is feedback-controlled based on the temperature information detected by the temperature sensor 263 such that the interior of the process chamber 201 has a desired temperature distribution. In addition, heating the interior of the process chamber 201 by the heater 207 may be continuously performed at least until processing the wafers 200 is completed. Rotating the boat 217 and the wafers 200 by the rotation mechanism 267 starts. Rotating the boat 217 and the wafers 200 by the rotation mechanism 267 may be continuously performed at least until processing the wafers 200 is completed.

(Si Film Forming Step)

Next, the following two steps, i.e., Steps 1 and 2, are performed sequentially.

[Step 1]

In this step, DCS gas is supplied to the wafer 200. Specifically, the valve 243a is opened and the DCS gas is allowed to flow through the gas supply pipe 232a. A flow rate of the DCS gas is adjusted by the WC 241a. The DCS gas is supplied into the process chamber 201 via the nozzle 249a and is exhausted from the exhaust pipe 231. In this operation, the DCS gas is supplied to the wafer 200. In addition, the valve 243d is opened to allow $N_2$ gas to flow through the gas supply pipe 232d. The $N_2$ gas is supplied into the process chamber 201 and is exhausted from the exhaust pipe 231, together with the DCS gas. In order to prevent the DCS gas from entering the nozzle 249b, the valve 243e is opened to allow $N_2$ gas to flow through the gas supply pipe 232e. The $N_2$ gas is supplied into the process chamber 201 via the gas supply pipe 232b and the nozzle 249b and is exhausted from the exhaust pipe 231.

By supplying the DCS gas to the wafer 200, it is possible to generate a DCS treatment effect and to perform a following process. As a result, a state of the surface of the wafer 200 can be changed to a state shown in FIG. 6B.

Specifically, DCS containing halogen (Cl) having high electronegativity is supplied to the surface of the wafer 200 to lead Cl in the DCS to oxygen (O) in the natural oxide film 200b formed on the surface of the wafer 200. As a result, Si—O bonds contained in the natural oxide film 200b can be broken. In other words, the Si—O bonds terminating at the surface of the monocrystalline Si can be broken by the polarity of the DCS. In addition, the Si—O bonds terminating at the surface of the monocrystalline Si can be broken by a small amount of (Cl ion) generated by the separation from the DCS. Accordingly, bonding hands of Si on the surface of the monocrystalline Si become free. That is to say, dangling bonds of Si can be generated on the surface of the monocrystalline Si. Thus, as described below, an environment in which homoepitaxial growth easily continues is prepared. As the above-described reaction proceeds on the surface of the wafer 200, the natural oxide film 200b formed on the surface of the wafer 200 is removed and the surface of the monocrystalline Si is exposed. As such, the DCS gas acts as a cleaning gas for removing the natural oxide film 200b from the surface of the monocrystalline Si. Further, in the case where a SiO film or the like is formed on the surface of the wafer 200, a Si adsorption site is formed on the surface of the SiO film or the like due to the above-described treatment effect.

When the environment where homoepitaxial growth easily continues on the surface of the wafer 200 is prepared by the treatment effect as described above, the valve 243a is closed and the supply of the DCS gas is stopped. At this time, while the APC valve 244 is kept in an open state, the interior of the process chamber 201 is vacuum-exhausted by the vacuum pump 246 to remove, from the interior of the process chamber 201, the gas remaining in the process chamber 201, which has not reacted or remains after contributing to the aforementioned reaction. In this operation, supplying the $N_2$ gas into the process chamber 201 is maintained by keeping the valves 243d and 243e in an open state. The $N_2$ gas acts as a purge gas.

[Step 2]

After Step 1 is completed, DS gas is supplied to the wafer 200. In this step, the opening and closing controls of the valves 243b, 243d, and 243e are performed in the same procedure as the opening and closing controls of the valves 243a, 243d, and 243e in Step 1. A flow rate of the DS gas flowing through the gas supply pipe 232b is adjusted by the MFC 241b. The DS gas is supplied into the process chamber 201 via the nozzle 249b and is exhausted from the exhaust pipe 231. In this operation, the DS gas is supplied to the wafer 200.

Figure 6C:
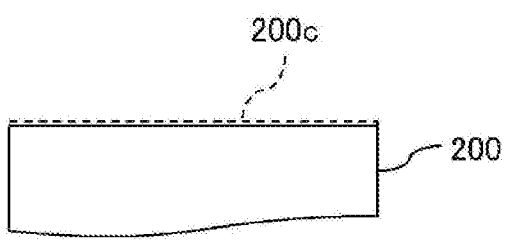
FIG. 6C illustrates a cross-sectional structure of the wafer surface after DS gas is supplied during the act of performing the Si film forming process.
Figure 6D:
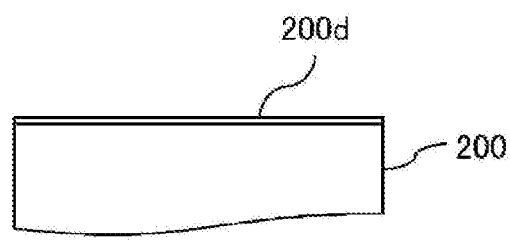
FIG. 6D illustrates a cross-sectional structure of the wafer surface after the Si film forming process is completed.

Supplying the DS gas to the wafer 200 causes the following process, whereby the state of the surface of the wafer 200 can be shifted to a state shown in FIG. 6C, namely a state in which a Si layer 200c is formed on the surface of the wafer 200.

Specifically, Si contained in the DS can be bonded to the dangling bonds of Si formed by carrying out Step 1. Nuclei of Si crystals can be formed on the surface of the wafer 200. Si crystals can be caused to epitaxially grow (gas-phase epitaxial growth). Since the underlying crystals and the crystals growing on the underlying crystals are formed of the same material (Si), this growth is homoepitaxial growth. In the homoepitaxial growth, crystals having the same lattice constant as the underlying crystals and made of the same material as the underlying crystals grow on the underlying crystals in the same crystal orientation as the underlying crystals. Therefore, in the homoepitaxial growth, it is possible to obtain crystals having a higher quality and fewer defects than in heteroepitaxial growth in which the underlying crystals and the crystals growing on the underlying crystals are formed of different materials. By performing the above process, the Si layer 200c made of Si monocrystals is formed on the surface of the wafer 200. In the case where a SiO film or the like is formed on the surface of the wafer 200, Si contained in the DS can be adsorbed onto the Si adsorption sites formed on the surface of the SiO film or the like by the aforementioned treatment effect. In this case, a Si film having an amorphous state, a polycrystalline state, or an amorphous/polycrystalline state is formed on the SiO film.

After the formation of the Si layer 200c is completed, the valve 243b is closed to stop supplying the DS gas. Then, by the same processing procedure as in Step 1, the reaction byproduct or the gas remaining in the process chamber 201, which has not reacted or remain after contributing the aforementioned reaction, is removed from the interior of the process chamber 201.

When Step 2 is performed, at least a portion of the surface of the wafer 200, namely at least a portion of the surface of the Si layer 200c, may be terminated with a Si—H bond contained in the DS gas. The Si—H bond terminating at the surface of the wafer 200 can be broken by supplying the DCS gas to the wafer 200 in following Step 1. Specifically, the Si—H bond terminating at the surface of the Si layer 200c can be broken by a small amount of Cl⁻ generated by the separation from the DCS. As a result, dangling bonds of Si can be formed on the surface of the Si layer 200c. In other words, an environment where the homoepitaxial growth is easily continued can be prepared again on the surface of the wafer 200. Thus, in following Step 2, the formation of the Si layer 200c described above may start without delay.

When Step 2 is performed, Si may abnormally grow on the surface of the wafer 200 in some cases. For example, when Step 2 is performed, Si adsorbed onto the surface of the wafer 200 may locally agglomerate and a concavo-convex structure may be formed on the surface of the Si layer 200c in some cases. However, the abnormally grown Si can be removed by supplying the DCS gas to the wafer 200 in following Step 1. Specifically, Si—Si bonds contained in the abnormally grown Si can be broken by a small amount of Cl⁻ generated by the separation from the DCS, thereby etching the abnormally grown Si. Thus, the surface of the Si layer 200c can be smoothened. As a result, it is possible to improve surface roughness or the like of the finally formed Si film. The term "surface roughness" used herein refers to a difference in height of a film in a wafer plane (the surface roughness is synonymous with surface coarseness). A smaller value of the surface roughness indicates that the surface is smoother. Thus, the improved surface roughness means that the height difference of the film is reduced and the smoothness of the surface is improved.

Each of the effects described here may be considered to be included in the treatment effect by the DCS as described above.

[Performing a Predetermined Number of Times]

A cycle including performing the above described Steps 1 and 2 alternately, i.e., non-simultaneously without synchronization, is performed a predetermined number of times ($n_1$ times). As a result, the following process can be caused to proceed, and the state of the surface of the wafer 200 can be shifted to a state shown in FIG. 6D, namely a state where a Si film 200d is formed on the surface of the wafer 200.

The Si film 200d is formed by the epitaxial growth of Si crystals using the Si layer 200c, which is formed on the surface of the wafer 200, as a base. A crystal structure of the Si film 200d is a monocrystalline structure inheriting the crystallinity of the base. That is to say, the Si film 200d is made of the same material as the underlying monocrystalline Si and is a monocrystalline Si film (epitaxial Si film) having the same lattice constant and the same crystal orientation as the underlying monocrystalline Si. When the Si film 200d is formed, by allowing the aforementioned treatment effect to be appropriately demonstrated, it is possible to form the Si film 200d as a dense film having few pinholes and film tears (hereinafter, generally referred to as film tears or the like). Thus, the Si film 200d can be formed as a film having a high effect of suppressing (or blocking) diffusion of oxidizing species, to be described below, or a film having a high resistance to HF. The pinholes refer to paths through which, when an etchant such as an etching gas or an etching liquid is supplied to the film, the etchant intrudes toward the base of the film. The film tears refer to, for example, a defect occurring on a larger scale than the pinholes. The film tears or the like are particularly likely to occur when a film thickness of the Si film 200d is made thin. Therefore, it can be said that the technical significance of generating the treatment effect is particularly great when the thickness of the Si film 200d is made thin.

Processing conditions of the Si film forming step are described below. The conditions referred to here are conditions capable of allowing the aforementioned treatment effect to be appropriately demonstrated.

A supply flow rate of the DCS gas in Step 1 is set to a predetermined flow rate which falls within a range, for example, of 1 to 2,000 sccm. A supply time of the DCS gas is set to a predetermined time which falls within a range, for example, of 1 to 600 seconds. A supply flow rate of the DS gas in Step 2 is set to a predetermined flow rate which falls within a range, for example, of 1 to 2,000 sccm. A supply time of the DS gas is set to a predetermined time which falls within a range, for example, of 1 to 600 seconds. In Steps 1 and 2, a supply flow rate of the $N_2$ gas supplied from each gas supply pipe is set to a predetermined flow rate which falls within a range of 0 to 10,000 sccm. Further, a partial pressure of each process gas may be increased and the layer quality may be improved by not supplying the $N_2$ gas.

A pressure $P_1$ in the process chamber 201 in Step 1 is set to be higher than a pressure $P_2$ in the process chamber 201 in Step 2 (i.e., $P_1 > P_2$). By doing so, it is possible to enhance the treatment effect as compared with the case of $P_1 \leq P_2$.

In other words, by ensuring that $P_1 > P_2$, it is possible to reduce a flow velocity of the DCS gas supplied into the process chamber 201 as compared with the case of $P_1 \leq P_2$. Thus, a contact time between the surface of the wafer 200 and the DCS can be prolonged, and an amount of thermal energy transferred from the heated wafer 200 to the DCS can be increased. This makes it possible to promote the separation of Cl from the DCS and to increase the amount of Cl⁻ supplied to the wafer 200. As a result, the treatment effect can be enhanced.

Furthermore, by ensuring that $P_1 > P_2$, it is possible to increase an amount of the DCS supplied to the wafer 200 as compared with the case of $P_1 \leq P_2$. Moreover, in the case of $P_1 > P_2$, as described above, it is possible to prolong the contact time between the surface of the wafer 200 and the DCS. Thus, the action due to the polarity of DCS, namely breaking the Si—O bond and the Si—H bond, is promoted. As a result, the treatment effect can be enhanced.

Under the film forming temperature to be described below, $P_1$ is preferably set to a predetermined pressure (first pressure) which falls within a range, for example, of 400 Pa to 1,000 Pa.

When $P_1$ is lower than 400 Pa, the amount of Cl that is separated from the DCS, namely the amount of Cl⁻ supplied to the wafer 200 may be insufficient, or the amount of the DCS supplied to the wafer 200 may be insufficient. Thus, the treatment effect described above may not be obtained in some cases. By setting $P_1$ to 400 Pa or higher, it is possible to sufficiently increase the amount of Cl⁻ and the amount of DCS supplied to the wafer 200, so that the aforementioned treatment effect can be obtained.

When $P_1$ exceeds 1,000 Pa, Si contained in the DCS supplied in Step 1 may be deposited on the wafer 200 in some cases. In such cases, Si is deposited before the natural oxide film is removed from the surface of the monocrystalline Si. Therefore, on the monocrystalline Si (on the natural oxide film), homoepitaxial growth does not proceed and an amorphous Si film or a polycrystalline Si film grows. In addition, when $P_1$ exceeds 1,000 Pa, the aforementioned treatment effect utilizing the polarity of DCS or the like may not be obtained in some cases. By setting $P_1$ to 1,000 Pa or lower, the above problems can be solved.

Further, under the film forming temperature to be described below, $P_2$ is preferably set to a predetermined pressure (second pressure) which falls within a range, for example, of 250 Pa to 350 Pa.

When $P_2$ is lower than 250 Pa, it is difficult for the DS supplied in Step 2 to be decomposed. It is sometimes difficult to form the Si layer 200c on the wafer 200. By setting $P_2$ to 250 Pa or higher, the above problem can be solved.

When $P_2$ exceeds 350 Pa, an excessive gas-phase reaction occurs. Thus, the step coverage or the uniformity of the thickness of the Si layer 200c are likely to be deteriorated and are difficult to control. Moreover, there is a concern that particles may be generated in the process chamber 201. By setting $P_2$ to 350 Pa or lower, the above problems can be solved.

In view of the foregoing, it is preferable to ensure that $P_1 > P_2$. $P_1$ is preferably set to a predetermined pressure which falls within a range, for example, of 400 Pa to 1,000 Pa, and $P_2$ is preferably set to a predetermined pressure which falls within a range, for example, of 250 Pa to 350 Pa. By setting the relationship between $P_1$ and $P_2$ as described above and by maintaining such a pressure balance, it is possible to further enhance the aforementioned treatment effect and to further improve the step coverage or the film thickness uniformity of the finally formed Si film.

A temperature of the wafer 200 (film forming temperature) in Steps 1 and 2 is set to a predetermined temperature which falls within a range, for example, of 350 to 450 degrees C., preferably 370 to 390 degrees C.

If the film forming temperature is lower than 350 degrees C., the aforementioned treatment effect may not be obtained in Step 1, and it may be difficult for the DS to be decomposed (thermally decomposed) in Step 2, in some cases. By setting the film forming temperature to 350 degrees C. or higher, the above problems can be solved. By setting the film forming temperature to 370 degrees C. or higher, it is possible to further enhance the aforementioned treatment effect in Step 1 and to further accelerate the decomposition of the DS in Step 2.

When the film forming temperature exceeds 450 degrees C., Si contained in the DCS supplied in Step 1 may be deposited on the wafer 200 in some cases. In such cases, as described above, the homoepitaxial growth does not proceed and an amorphous Si film or a polycrystalline Si film grows on the monocrystalline Si (on the natural oxide film). In addition, when the film forming temperature exceeds 450 degrees C., the aforementioned treatment effect utilizing the polarity of DCS or the like may not be obtained in some cases. By setting the film forming temperature to 450 degrees C. or lower, the above problems can be solved. By setting the film forming temperature to 390 degrees C. or lower, it is possible to further enhance the aforementioned treatment effect while the deposition of the Si contained in the DCS on the wafer 200 is reliably suppressed.

The number of times of performing the cycle which includes alternately performing Steps 1 and 2 is set to a predetermined number of times which falls within a range, for example, of 5 to 20 times, preferably 10 to 15 times. Thus, a film thickness T of the Si film 200d thus formed can be set to a predetermined thickness which falls within a range, for example, of 10 to 40 Å (1 to 4 nm), preferably 20 to 30 Å (2 to 3 nm). Further, by performing the cycle multiple times, it is possible to increase a density of the Si layer 200c and to prevent the Si layer 200c from growing in an island shape. Thus, the Si film 200d formed on the wafer 200 can be allowed to become a dense film having a good surface roughness and few film tears or the like.

As the first process gas, it may be possible to use a chlorosilane precursor gas such as monochlorosilane ($SiH_3Cl$, abbreviation: MCS) gas, trichlorosilane ($SiHCl_3$, abbreviation: TCS) gas, tetrachlorosilane ($SiCl_4$, abbreviation: STC) gas, hexachlorodisilane ($Si_2Cl_6$, abbreviation: HCDS) gas or the like, besides the DCS gas. In order to promote the aforementioned breakage reaction of the Si—O bond while suppressing the deposition of Si on the wafer 200 in Step 1, it is preferable to use, as the first process gas, a halosilane precursor gas in which the number of Si atoms contained in one molecule is small and in which the number of halogen elements (Cl and the like) contained in one molecule is large. In Step 1, in order to properly suppress the aforementioned breakage reaction of the Si—O bond, it is preferable to use a halosilane precursor gas in which the number of halogen elements (Cl and the like) contained in one molecule is small.

As the second process gas, it may be possible to use a halogen-element-free silane precursor gas such as monosilane ($SiH_4$) gas, trisilane ($Si_3H_8$) gas, tetrasilane ($Si_4H_{10}$) gas, pentasilane ($Si_5H_{12}$) gas, hexasilane ($Si_6H_{14}$) or the like, besides the DS gas.

As the inert gas, it may be possible to use, for example, a rare gas such as Ar gas, He gas, Ne gas, Xe gas or the like, besides the $N_2$ gas.

(SiO Film Forming Step)

Figure 6E:
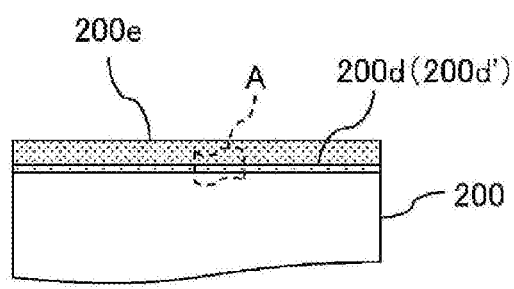
FIG. 6E illustrates a cross-sectional structure of the wafer surface after an oxide film forming process is completed.

By performing a SiO film forming step after the Si film 200d is formed, the state of the surface of the wafer 200 can be shifted to a state shown in FIG. 6E, namely a state in which a silicon oxide film (SiO film) 200e as a film containing Si and O is formed on the surface of the wafer 200 (on the Si film 200d).

In the SiO film forming step, for example, as indicated in the film forming sequence below, a cycle which includes non-simultaneously performing Step 3 of supplying, as a precursor gas, for example, an aminosilane precursor gas such as bisdiethylaminosilane ($SiH_2[N(C_2H_5)_2]_2$, abbreviation: BDEAS) gas or the like to the wafer 200 accommodated in the process chamber 201, and Step 4 of supplying, as an oxidizing agent, for example, an O-containing gas such as plasma-excited oxygen ($O_2^*$) gas or the like to the wafer 200 accommodated in the process chamber 201, is performed a predetermined number of times ($n_2$ times where $n_2$ is an integer equal to or greater that 1). As the precursor gas, it may be possible to use the chlorosilane precursor gas described above, besides the aminosilane precursor gas. As the oxidizing agent, it may be possible to use $O_3$ gas or a combination of $O_2$ gas and $H_2$ gas, besides the $O_2^*$ gas. These gases can be supplied from the gas supply system described above.

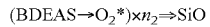

When the SiO film 200e is formed, the $O_2^*$ supplied to the wafer 200 in Step 4 is supplied not only to a Si-containing layer (Si layer or BDEAS adsorption layer) formed on the wafer 200 (the Si film 200d) by performing Step 3 but also to the Si film 200d which is a film formation base. That is to say, a portion of the oxidizing species ($O_2^*$) supplied to the wafer 200 diffuses (passes through) the Si-containing layer formed on the Si film 200d by performing Step 3 and reaches the Si film 200d. As a result, at least a portion of the Si film 200d may be oxidized and modified into a Si film 200d' containing oxygen (O) (SiO film).

However, as in the present embodiment, by setting the film thickness T of the Si film 200d to a predetermined film thickness which falls within the aforementioned range (for example, 1 to 4 nm, preferably 2 to 3 nm), the diffusion of the oxidizing species moving from the surface of the Si Film 200d toward the wafer 200 is blocked by the Si film 200d. In other words, most of the oxidizing species supplied to the Si film 200d is consumed by oxidizing the Si film 200d. Little or no oxidizing species is supplied to the surface of the wafer 200. In view of these facts, the Si film 200d may be regarded as an oxidation blocking film which suppresses the diffusion of the oxidizing species moving from the surface of the Si film 200d toward the wafer 200. In addition, the Si film 200d may be regarded as a film to be oxidized instead of the wafer 200 namely a sacrificial Si film or an oxygen absorption film (buffer film), when the oxide film is formed on the surface of the wafer 200.

Figure 6F:
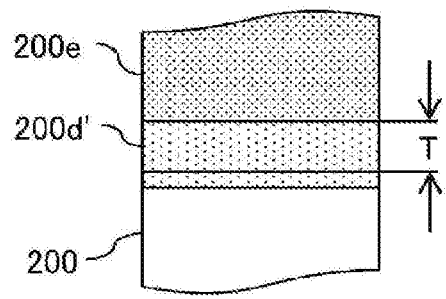
FIG. 6F illustrates an example of a partial enlarged view of a region A in FIG. 6E.

In the case where the film thickness T of the Si film 200d is set to a relatively small film thickness (for example, a film thickness greater than or equal to 1 nm and smaller than 2 nm) which falls within the aforementioned range, as shown as a partially enlarged view in FIG. 6F, the Si film 200d is oxidized over the entire region in the film thickness direction and is modified into a SiO film 200d'. In this case, a portion of the oxidizing species supplied to the wafer 200 diffuses (passes through) the Si film 200d and reaches the wafer 200 in some cases. As a result, the surface of the wafer 200 may be slightly oxidized in some cases. However, by setting the film thickness T of the Si film 200d to the predetermined film thickness which falls within the aforementioned range, the region where the wafer 200 is oxidized is suppressed within a range of 1 nm or smaller in depth from the surface of the wafer 200. As such, the substantial height of the surface of the wafer 200 may be lowered by about 1 nm at the maximum and kept almost unchanged. Each of the SiO film 200d' obtained by oxidizing the Si film 200d and the oxidized surface of the wafer 200 may be regarded as being included in a part of the SiO film 200e.

Figure 6G:
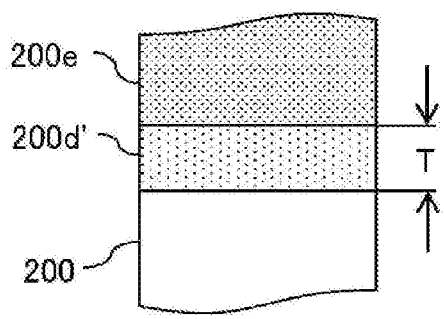
FIG. 6G illustrates another example of the partial enlarged view of the region A in FIG. 6E.

Further, when the film thickness T of the Si film 200d is set to an intermediate film thickness (for example, a film thickness greater than or equal to 2 nm and smaller than or equal to 3 nm) which falls within the aforementioned range, as shown as a partially enlarged view in FIG. 6G, the Si film 200d is oxidized over the entire region in the film thickness direction and is modified into a SiO film 200d'. In this case, most of the oxidizing species supplied to the Si film 200d is consumed by oxidizing the Si film 200d. As a result, the oxidation of the surface of the wafer 200 is avoided, and the height of the surface of the wafer 200 is kept unchanged. As described above, the SiO film 200d' obtained by oxidizing the Si film 200d may be regarded as being included in a part of the SiO film 200e.

Figure 6H:
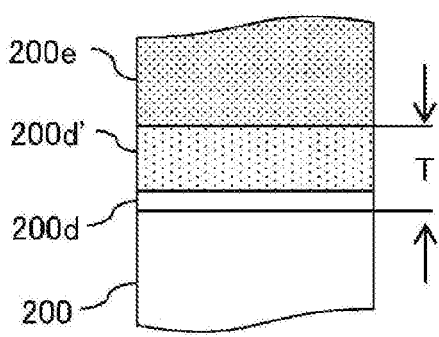
FIG. 6H illustrates still another example of the partial enlarged view of the region A in FIG. 6E.

In addition, when the film thickness T of the Si film 200d is set to a relatively large film thickness (for example, a film thickness of greater than 3 nm and smaller than or equal to 4 nm) which falls within the aforementioned range, as shown as a partially enlarged view in FIG. 6H, most regions of the Si film 200d (the region excluding the vicinity of the interface with the wafer 200) may be oxidized and modified into a Si film 200d' containing O. On the other hand, a portion of the region of the Si film 200d (the region close to the interface with the wafer 200) is maintained as the Si film 200d without being oxidized. As such, a sandwich structure in which the Si film 200d is sandwiched between the wafer 200 and the SiO film 200d' is formed in the vicinity of the surface of the wafer 200. Since the Si film 200d sandwiched between the wafer 200 and the SiO film 200d' is made of Si monocrystals epitaxially grown on the surface of the wafer 200, the Si film 200d may be regarded as being included in a part of the wafer 200. However, by setting the film thickness T of the Si film 200d to the predetermined film thickness which falls within the aforementioned range, the film thickness of the Si film 200d sandwiched between the wafer 200 and the SiO film 200d' is suppressed within a range of 1 nm or less. Thus, the substantial height of the surface of the wafer 200 may be increased by about 1 nm at the maximum and kept almost unchanged. As described above, the SiO film 200d' obtained by oxidizing the Si film 200d may be regarded as being included in a part of the SiO film 200e.

As described above, before the SiO film forming step is performed, the Si film 200d is formed in advance on the surface of the wafer 200 and the film thickness T of the Si film 200d is appropriately adjusted. Thus, it is possible to keep the substantial height of the surface of the wafer 200 almost unchanged. Even though the film thickness T of the Si film 200d is set to such an extremely small film thickness, the aforementioned diffusion blocking effect for the oxidation species is obtained. This is because the Si film 200d formed in the Si film forming step is an extremely dense film free from film tears or the like.

(After-Purging and Return to Atmospheric Pressure)

After the formation of the SiO film 200e is completed, $N_2$ gas is supplied into the process chamber 201 from each of the gas supply pipes 232d and 232e and is exhausted from the exhaust pipe 231. The $N_2$ gas acts as a purge gas. Thus, the interior of the process chamber 201 is purged with the inert gas. The gas and the reaction byproduct remaining in the process chamber 201 are removed from the interior of the process chamber 201 (after-purging). Thereafter, the atmosphere in the process chamber 201 is replaced by an inert gas (inert gas replacement), and the internal pressure of the process chamber 201 returns to atmospheric pressure (return to atmospheric pressure).

(Boat Unloading and Wafer Discharging)

The seal cap 219 is moved down by the boat elevator 115 and the lower end of the reaction tube 203 is opened. Then, the processed wafers 200 supported by the boat 217 are unloaded from the lower end of the reaction tube 203 out of the reaction tube 203 (boat unloading). The processed wafers 200 are taken out of the boat 217 (wafer discharging).

(3) Effects according to the Present Embodiment

According to the present embodiment, one or more effects as set forth below may be achieved.

(a) In the Si film forming step, by performing Step 1 of supplying the DCS gas containing a halogen element to the wafer 200 with monocrystalline Si exposed on its surface, the natural oxide film 200b formed on the surface of the wafer 200 can be removed by the treatment effect offered by the DCS, and dangling bonds of Si can be generated on the surface of the wafer 200. This makes it possible to start epitaxial growth on the surface of the wafer 200 without delay and to cause the epitaxial growth to proceed efficiently. The Si film 200d is formed as an epitaxial Si film. Thus, at least when the Si film 200d is used without being oxidized, the Si film 200d becomes a high quality film whose contact resistance for the wafer 200 or the like is lower than that of an amorphous Si film or a polycrystalline Si film and whose electrical characteristic is superior to that of an amorphous Si film or a polycrystalline Si film. When a halogen-element-free silane precursor gas such as a silicon hydride precursor gas or an aminosilane precursor gas is used instead of the DCS gas, an epitaxial Si film hardly grows on the wafer 200. Thus, it is difficult to obtain the aforementioned effects.

(b) In the Si film forming step, the internal pressure ($P_1$) of the process chamber 201 in Step 1 is set to be higher than the internal pressure ($P_2$) of the process chamber 201 in Step 2 ($P_1 > P_2$). Therefore, as compared with the case of $P_1$ it is possible to enhance the treatment effect described above. Thus, the Si film 200d formed on the wafer 200 can be a dense film with less film tears or the like. By forming the Si film 200d into a dense film, it is possible to make the Si film 200d become a film having a lower contact resistance for the wafer 200 and the like.

(c) By forming the Si film 200d in advance on the surface of the wafer 200 before performing the SiO film forming step, it becomes possible to make the Si film 200d serve as an oxidation blocking film (or an oxygen absorption film). This makes it possible to suppress the oxidation of the wafer 200 in the SiO film forming step. In particular, the Si film 200d formed in the present embodiment is a dense film with few film tears or the like as described above. Thus, even in the case where the film thickness T is set to an extremely small film thickness which falls within a range, for example, of 1 to 4 nm, it is possible to enable the Si film 200d to sufficiently serve as an oxidation blocking film or the like and to reliably suppress the oxidation of the wafer 200.

(d) By setting the film thickness T of the Si film 200d to an appropriate film thickness, it is possible to keep the substantial height of the surface of the wafer 200 almost unchanged. For example, by setting the film thickness T of the Si film 200d to a predetermined film thickness which falls within a range of 1 to 4 nm, it is possible to suppress the variation amount of the substantial height of the surface of the wafer 200 to within 1 nm. Furthermore, for example, by setting the film thickness T of the Si film 200d to a predetermined film thickness which falls within a range of 2 to 3 nm, it is possible to reduce the variation amount of the substantial height of the surface of the wafer 200 to a negligible level, namely a level that hardly affects the performance and quality of a semiconductor device formed on the wafer 200. As a result, it is possible to reduce the design burden of a semiconductor device fabricated on the wafer 200 and to improve the manufacturing yield.

(e) By configuring the Si film 200d as an epitaxial Si film, it is possible to avoid deterioration in the performance of a semiconductor device formed on the wafer 200. That is to say, when the SiO film forming step is performed as described above, a sandwich structure shown in FIG. 6H may be formed depending on the processing conditions, the film thickness T of the Si film 200d, and the like. Even in this case, by configuring the Si film 200d as an epitaxial Si film, it is possible to allow the film sandwiched between the wafer 200 and the SiO film 200d' to become a film having a low contact resistance for the wafer 200 or the like and excellent electrical characteristics. Thus, it is possible to avoid deterioration in the performance of a semiconductor device formed on the wafer 200. In contrast, when the Si film 200d is not an epitaxial Si film but an amorphous Si film or a polycrystalline Si film, the film sandwiched between the wafer 200 and the SiO film 200d' may become a film having a high contact resistance for the wafer 200 or the like, which may cause a reduction in the performance of a semiconductor device formed on the wafer 200 in some cases.

(f) By setting the film thickness T of the Si film 200d to a thickness of 1 nm or greater, for example, about 1 to 4 nm, it is possible to allow the SiO film 200e formed on the wafer 200 to be a dense film having a good surface roughness and few film tears or the like. Presumably, this is because, by setting the thickness of the Si film 200d to 1 nm or greater, the Si film 200d has a continuous state (non-island state) and the SiO film 200e formed thereon tends to grow at a uniform timing and speed in the plane of the wafer 200.

(g) The aforementioned effects can be similarly obtained when a halosilane precursor gas other than the DCS gas is used as the first process gas or when a silicon hydride precursor gas other than the DS gas is used as the second process gas.

(4) Modification Examples

The film forming sequence in the present embodiment is not limited to the above-described aspect but may be changed as indicated in the following modification examples.

(Modification Example 1)

The Si film forming step may include a time period in which a step of supplying DCS gas and a step of supplying hydrogen ($H_2$) gas as a H-containing gas are simultaneously performed. For example, as indicated in Modification Example 1 of FIG. 4 and the film forming sequence below, in the Si film forming step, it may be possible to alternately perform: a step of simultaneously performing the step of supplying the DCS gas and the step of supplying the $H_2$ gas; and the step of supplying the DS gas. The $H_2$ gas can be supplied, for example, from the gas supply pipe 232c. A supply flow rate of the $H_2$ gas is set to a predetermined flow rate which falls within a range, for example, of 1 to 10,000 sccm. A supply time of the $H_2$ gas is set to a predetermined time which falls within a range, for example, of 1 to 600 seconds.

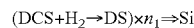

$$(DCS+H_2 \rightarrow DS) \times n_1 \Rightarrow Si$$

In this modification example, the same effects as those of the basic sequence shown in FIG. 4 can be obtained. Furthermore, by supplying the $H_2$ gas to the wafer 200, this modification example may effectively remove residual Cl which is generated by the above-described treatment using the DCS gas and which becomes a cause of inhibiting the nucleus formation by the DS gas in Step 2. However, it is necessary to set a supply amount (a supply flow rate and a supply time) of the $H_2$ gas to such an extent as not to hinder the aforementioned treatment effect.

(Modification Example 2)

As indicated in Modification Example 2 of FIG. 4 and the film forming sequence below, in the Si film forming step, the step of supplying the $H_2$ gas in Modification Example 1 may be continued until the step of supplying the DS gas is started after the step of supplying the DCS gas is completed. That is to say, in the Si film forming step, the step of supplying the $H_2$ gas may be started simultaneously with the step of supplying the DCS gas and may be continuously performed until the step of supplying the DS gas is started.

$$(DCS+H_2 \rightarrow H_2=DS) \times n_1 \Rightarrow Si$$

In this modification example, the same effects as those of Modification Example 1 can be obtained. Furthermore, this modification example may further enhance the removal effect of the residual Cl, as compared with Modification Example 1.

(Modification Example 3)

As indicated in Modification Example 3 of FIG. 4 and the film forming sequence below, in the Si film forming step, the step of supplying the $H_2$ gas may be performed simultaneously with the step of exhausting the DCS gas from the interior of the process chamber 201. That is to say, the step of supplying the $H_2$ gas may be performed after the step of supplying the DCS gas is completed and before the step of supplying the DS gas is started. In this example, the step of supplying the $H_2$ gas is performed non-simultaneously with the step of supplying the DCS gas and the step of supplying the DS gas.

$$DCS \rightarrow H_2 \rightarrow DS) \times n_1 \Rightarrow Si$$

In this modification example, the same effects as those of the film forming sequence shown in FIG. 4 and Modification Example 1 can be obtained.

(Modification Example 4)

The Si film forming step may include a time period in which the step of supplying the DS gas and the step of supplying the $H_2$ gas are simultaneously performed. For example, as indicated in Modification Example 4 of FIG. 4 and the film forming sequence below, in the Si film forming step, it may be possible to alternately perform: the step of supplying the DCS gas; and the step of simultaneously performing the step of supplying the DS gas and the step of supplying the $H_2$ gas.

$$(DCS \rightarrow DS+H_2) \times n_1 \Rightarrow Si$$

By the action of the $H_2$ gas, this modification example may suppress the reaction for forming a nucleus, which is generated in the step of supplying the DS gas, so that most of the DS gas is not consumed at a peripheral portion of the wafer 200. It is also easy to supply a sufficient amount of the DS gas to a central portion of the wafer 200 without consuming a large amount of the DS gas in the peripheral edge portion of the wafer 200. Furthermore, by the action of the $H_2$ gas, it is possible to improve the thermal conductivity and to uniformly heat the wafer 200. Thus, in the step of supplying the DS gas, Si can be uniformly adsorbed onto the wafer 200, and the film thickness uniformity in the plane of the film formed on the wafer 200 can be improved. As a result, the Si film formed on the wafer 200 can be allowed to become a dense film with fewer film tears or the like.

(Modification Example 5)

As indicated in Modification Example 5 of FIG. 4 and the film forming sequence below, in the Si film forming step, the step of supplying the $H_2$ gas in Modification Example 4 may be continued until the following step of supplying the DCS gas is started after the step of supplying the DS gas is completed. That is to say, the step of supplying the $H_2$ gas may be started simultaneously with the step of supplying the DS gas and may be continuously performed until the following step of supplying the DCS gas is started.

$$(DCS \rightarrow DS+H_2 \rightarrow H_2) \times n_1 \Rightarrow Si$$

In this modification example, the same effects as those of Modification Example 4 can be obtained. Furthermore, this modification example may further enhance the reaction suppressing effect and the thermal conductivity improving effect, as compared with Modification Example 4.

(Modification Example 6)

As indicated in Modification Example 6 of FIG. 4 and the film forming sequence below, in the Si film forming step, the step of supplying the $H_2$ gas may be performed simultaneously with the step of exhausting the DS gas from the interior of the process chamber 201. That is to say, the step of supplying the $H_2$ gas may be performed after the step of supplying the DS gas is completed and before the following step of supplying the DCS gas is started. In this example, the step of supplying the $H_2$ gas is performed non-simultaneously with the step of supplying the DCS gas and the step of supplying the DS gas.

$$(DCS \rightarrow DS \rightarrow H_2) \times n_1 \Rightarrow Si$$

In this modification example, the same effects as those of Modification Example 4 can be obtained.

(Modification Example 7)

The Si film forming step may include a time period in which the step of supplying the DCS gas and the step of supplying the $H_2$ gas are simultaneously performed and a time period in which the step of supplying the DS gas and the step of supplying the $H_2$ gas are simultaneously performed. For example, as indicated in Modification Example 7 of FIG. 4 and the film forming sequence below, in the Si film forming step, it may be possible to alternately perform: the step of simultaneously performing the step of supplying the DCS gas and the step of supplying the $H_2$ gas; and the step of simultaneously performing the step of supplying the DS gas and the step of supplying the $H_2$ gas.

$$(DCS+H_2 \rightarrow DS+H_2) \times n_1 \Rightarrow Si$$

According to this modification example, the same effects as those of Modification Example 1 and the same effects as those of Modification Example 4 can be obtained.

(Modification Example 8)

As indicated in Modification Example 8 shown in FIG. 4, the supply flow rate of the $H_2$ gas supplied in the time period in which the step of supplying the DS gas and the step of supplying the $H_2$ gas are simultaneously performed in Modification Example 7 may be set to be greater than the supply flow rate of the $H_2$ gas supplied in the time period in which the step of supplying the DCS gas and the step of supplying the $H_2$ gas are simultaneously performed. This modification example may enhance the reaction suppressing effect and the thermal conductivity improving effect, in addition to obtaining the same effects as those of Modification Example 7.

(Modification Example 9)

As indicated in Modification Example 9 shown in FIG. 4, the supply flow rate of the $H_2$ gas supplied in the time period in which the step of supplying the DCS gas and the step of supplying the $H_2$ gas are simultaneously performed in Modification Example 7 may be set to be greater than the supply flow rate of the $H_2$ gas supplied in the time period in which the step of supplying the DS gas and the step of supplying the $H_2$ gas are simultaneously performed. This modification example may enhance the residual Cl removal effect, in addition to obtaining the same effects as those of modification 7.

(Modification Example 10)

As indicated in Modification Example 10 shown in FIG. 4, the $H_2$ gas may be continuously supplied. That is to say, in the Si film forming step, the step of supplying the DCS gas and the step of supplying the DS gas may be performed alternately while the step of supplying the $H_2$ gas is performed. This modification example may obtain the same effects as those of Modification Examples 1 to 7.
(Modification Example 11)

The Si film forming step may include a time period in which the step of supplying the DS gas and the step of supplying phosphine ($PH_3$, abbreviation: PH) gas as a dopant gas are simultaneously performed. For example, as indicated in Modification Example 11 of FIG. 4 and the film forming sequence below, in the Si film forming step, it may be possible to alternately perform: the step of supplying the DCS gas; and the step of simultaneously performing the step of supplying the DS gas and the step of supplying the PH gas. The PH gas can be supplied, for example, from the gas supply pipe 232c. A supply flow rate of the PH gas is set to a predetermined flow rate which falls within a range, for example, of 1 to 2,000 sccm. A supply time of the PH gas is set to a predetermined time which falls within a range, for example, of 1 to 600 seconds.

$$(DCS \rightarrow DS+PH) \times n_1 \Rightarrow Si$$

In this modification example, the same effects as those of the basic sequence shown in FIG. 5 (the same sequence as the basic sequence shown in FIG. 4) can be obtained. Furthermore, according to this modification example, by supplying the PH gas to the wafer 200, it is possible to dope (add) P as a dopant into the Si film and to impart electrical conductivity to the Si film. As a result, the Si film can become a high quality film whose contact resistance for the wafer 200 or the like is lower than that of a P-free epitaxial Si film, and whose electrical characteristics are superior to those of a P-free epitaxial Si film. Furthermore, even if the sandwich structure shown in FIG. 6H is formed when the SiO film forming step is executed after forming the Si film, it is possible to allow the film sandwiched between the wafer 200 and the SiO film 200d' to become a film having a low contact resistance for the wafer 200 or the like and excellent electrical characteristics. Thus, it is possible to avoid deterioration in performance of a semiconductor device. The P concentration in the Si film may be, for example, $1 \times 10^{10}$ to $1 \times 10^{23}$ atoms/cm$^3$.
(Modification Example 12)

The Si film forming step may include a time period in which the step of supplying the DCS gas and the step of supplying the PH gas are simultaneously performed. For example, as indicated in Modification 12 of FIG. 5 and the film formation sequence below, in the Si film forming step, it may be possible to alternately perform: the step of simultaneously performing the step of supplying the DCS gas and the step of supplying the PH gas; and the step of supplying the DS gas.

$$(DCS+PH \rightarrow DS) \times n_1 \Rightarrow Si$$

In this modification example, it is possible to dope P into the Si film formed on the wafer 200 and to impart electrical conductivity to the Si film. Furthermore, this modification example may set the P concentration in the Si film formed on the wafer 200 to be smaller than the P concentration in the Si film formed in Modification Example 11. As such, the P concentration in the Si film formed on the wafer 200 can be adjusted to be relatively lower.
(Modification Example 13)

The Si film forming step may include a time period in which the step of supplying the DCS gas and the step of supplying the PH gas are simultaneously performed and a time period in which the step of supplying the DS gas and the step of supplying the PH gas are simultaneously performed. For example, as indicated in Modification Example 13 of FIG. 5 and the film forming sequence below, in the Si film forming step, it may be possible to alternately perform: the step of simultaneously performing the step of supplying the DCS gas and the step of supplying the PH gas; and the step of simultaneously performing the step of supplying the DS gas and the step of supplying the PH gas.

$$(DCS+PH \rightarrow DS+PH) \times n_1 \Rightarrow Si$$

According to this modification example, it is possible to set the P concentration in the Si film formed on the wafer 200 to be smaller than the P concentration in the Si film formed in Modification Example 11. As such, the P concentration in the Si film formed on the wafer 200 can be adjusted to be relatively lower.
(Modification Example 14)

As indicated in Modification Example 14 of FIG. 5 and the film forming sequence below, in the Si film forming step, the step of supplying the PH gas may be performed simultaneously with the step of exhausting the DS gas from the interior of the process chamber 201. That is to say, the step of supplying the PH gas may be performed after the step of supplying the DS gas is completed and before the following step of supplying the DCS gas is started. In this example, the step of supplying the PH gas is performed non-simultaneously with the step of supplying the DCS gas and the step of supplying the DS gas.

$$(DCS \rightarrow DS \rightarrow PH) \times n_1 \Rightarrow Si$$

In this modification example, it is possible to dope P into the Si film formed on the wafer 200 and to impart electrical conductivity to the Si film. Furthermore, this modification example may set the P concentration in the Si film formed on the wafer 200 to be smaller than the P concentration in the Si film formed in Modification Example 11. As such, the P concentration in the Si film formed on the wafer 200 can be adjusted to be relatively lower.
(Modification Example 15)

As indicated in Modification Example 15 of FIG. 5 and the film forming sequence below, in the Si film forming step, the step of supplying the PH gas may be performed simultaneously with the step of exhausting the DCS gas from the interior of the process chamber 201. That is to say, the step of supplying the PH gas may be performed after the step of supplying the DCS gas is completed and before the step of supplying the DS gas is started. In this example, the step of supplying the PH gas is performed non-simultaneously with the step of supplying the DCS gas and the step of supplying the DS gas.

$$(DCS \rightarrow PH \rightarrow DS) \times n_1 \Rightarrow Si$$

In this modification example, it is possible to dope P into the Si film formed on the wafer 200 and to impart electrical conductivity to the Si film. Furthermore, this modification example may set the P concentration in the Si film formed on the wafer 200 to be smaller than the P concentration in the Si film formed in modification 11. As such, the P concentration in the Si film formed on the wafer 200 can be adjusted to be relatively lower.
(Modification Example 16)

As indicated in the Modification Example 16 of FIG. 5 and the film formation sequence below, in the Si film forming step, the step of supplying the PH gas may be performed after the step of supplying the DCS gas is completed and before the step of supplying the DS gas is started, and may be performed after the step of supplying the DS gas is completed and before the following step of supplying the DCS gas is started. In this example, the step of supplying the PH gas is performed non-simultaneously with the step of supplying the DCS gas and the step of supplying the DS gas.

$$(DCS \rightarrow PH \rightarrow DS \rightarrow PH) \times n_1 \Rightarrow Si$$

In this modification example, it is possible to dope P into the Si film formed on the wafer 200 and to impart electrical conductivity to the Si film. Furthermore, this modification example may set the P concentration in the Si film formed on the wafer 200 to be smaller than the P concentration in the Si film formed in modification 13. As such, the P concentration in the Si film formed on the wafer 200 can be adjusted to be relatively lower.

(Modification Example 17)

As indicated in Modification Example 17 of FIG. 5 and the film forming sequence below, in the Si film forming step, the step of supplying the PH gas in Modification Example 11 may be continued until the following step of supplying the DCS gas is started after the step of supplying the DS gas is completed. That is to say, the step of supplying the PH gas may be started simultaneously with the step of supplying the DS gas and may be continuously performed until the following step of supplying the DCS gas is started.

$$(DCS \rightarrow DS+PH \rightarrow PH) \times n_1 \Rightarrow Si$$

In this modification example, it is possible to dope P into the Si film formed on the wafer 200 and to impart electrical conductivity to the Si film. Furthermore, this modification example may set the P concentration in the Si film formed on the wafer 200 to be larger than the P concentration in the Si film formed in modification 11. As such, the P concentration in the Si film formed on the wafer 200 can be adjusted to be higher.

(Modification Example 18)

As indicated in Modification Example 18 of FIG. 5 and the film forming sequence below, in the Si film forming step, the step of supplying the PH gas in Modification Example 12 may be continued until the step of supplying the DS gas is started after the step of supplying the DCS gas is completed. That is to say, in the Si film forming step, the step of supplying the PH gas may be started simultaneously with the step of supplying the DCS gas and may be continuously performed until the step of supplying the DS gas is started.

$$(DCS+PH \rightarrow PH \rightarrow DS) \times n_1 \Rightarrow Si$$

In this modification example, it is possible to dope P into the Si film formed on the wafer 200 and to impart electrical conductivity to the Si film. Furthermore, this modification example may set the P concentration in the Si film formed on the wafer 200 to be larger than the P concentration in the Si film formed in modification 12. As such, the P concentration in the Si film formed on the wafer 200 can be adjusted to be higher.

(Modification Example 19)

As indicated in modification 19 shown in FIG. 5, the PH gas may be continuously supplied. That is to say, in the Si film forming step, the step of supplying the DCS gas and the step of supplying the DS gas may be performed alternately while the step of supplying the PH gas is performed. This modification example may obtain the same effects as those of Modification Examples 11 to 18.

(Modification Example 20)

As indicated in the film forming sequence indicated below, in the Si film forming step, a step of forming a first layer not doped with P (a non-dope Si layer) on the wafer 200 by performing a first set a predetermined number of times (m times where m is an integer equal to or greater than 1) and a step of forming a second layer doped with P (a doped Si layer) on the first layer by performing a second set a predetermined number of times (n times where n is an integer of 1 or more), in which the first set includes the step of supplying the DCS gas and the step of supplying the DS gas and the second set includes the step of supplying the DCS gas and the step of supplying the DS gas, may be performed so that a Si film obtained by laminating the first layer and the second layer is formed on the wafer 200.

$$(DCS \rightarrow DS) \times m \rightarrow (DCS \rightarrow DS+PH) \times n \Rightarrow Si$$

In this modification example, by reducing a supply flow rate of the PH gas, namely a doping amount of P, at an initial stage of forming the Si film, it is possible to prepare an environment or a state in which the epitaxial growth of the Si film is more likely to occur. As a result, it is easy to obtain the effect of reducing the contact resistance by allowing the Si film to become an epitaxial Si film. Furthermore, in this modification example, by increasing the supply flow rate of the PH gas, namely the doping amount of P, after the initial stage of forming the Si film, it becomes easy to increase the electrical conductivity of the Si film. As a result, it is easy to obtain the effect of reducing the contact resistance by doping P into the Si film.

(Modification Example 21)

In the Si film forming step, while the residual gas removal step of removing the residual gas and the like from the interior of the process chamber 201 may be performed in each of Steps 1 and 2, such a residual gas removal step may not be performed. According to this modification example, it is possible to shorten the time required for the Si film forming step and to improve the productivity of the film forming process.

(Modification Example 22)

A chlorosilane precursor gas, for example, HCDS gas, MCS gas, or the like, other than the DCS gas, may be used as the first process gas. In this modification example, by setting various processing conditions like the processing conditions of the film forming sequence shown in FIG. 4, the same effects as those of the basic sequence shown in FIG. 4 can be obtained. In addition, by using the HCDS gas having a larger number of Cl atoms contained in one molecule than the DCS gas as the first processing gas, it is possible to further enhance the aforementioned treatment effect as compared with the film forming sequence shown in FIG. 4.

(Modification Example 23)

Instead of the carbon (C)-free silane precursor gas, a C-containing silane precursor gas, for example, a silane precursor gas having a Si—C bond may be used as the first process gas. For example, 1,1,2,2-tetrachloro-1,2-dimethyl-disilane ($(CH_3)_2Si_2Cl_4$, abbreviation: TCDMDS) gas, bis(trichlorosilyl)methane ($(SiCl_3)_2CH_2$, abbreviation: BTCSM) gas, or the like may be used as the first process gas. In this modification example, by setting various processing conditions like the processing conditions of the basic sequence shown in FIG. 4, the same effects as those of the basic sequence shown in FIG. 4 can be obtained. Furthermore, according to this modification example, it is possible to dope a small amount of C into the Si film formed in the Si film forming step.

(Modification Example 24)

A halosilane precursor gas containing a halogen group other than Cl, for example, a halosilane precursor gas containing F, Br, I, or the like may be used as the first process gas. For example, a fluorosilane precursor gas such as tetrafluorosilane ($SiF_4$) gas or the like, a bromosilane precursor gas such as tetrabromosilane (SiBr$_4$) gas or the like, an iodosilane precursor gas such as tetraiodosilane (SiI$_4$) gas or the like, and so forth, may be used as the first process gas. In this modification example, by setting various processing conditions like the processing conditions of the basic sequence shown in FIG. 4, the same effects as those of the basic sequence shown in FIG. 4 can be obtained.

(Modification Example 25)

A Si-free chloro-based gas containing a chloro group may be used as the first process gas. Furthermore, a Si-free halogen-based gas containing a halogen group other than Cl may be used as the first process gas. For example, hydrogen chloride (HCl) gas, chlorine (Cl$_2$) gas, boron chloride (BCl$_3$) gas, or chlorine fluoride (ClF$_3$) gas may be used as the first process gas. In this modification example, by setting various processing conditions like the processing conditions of the basic sequence shown in FIG. 4, the same effects as those of the basic sequence shown in FIG. 4 can be obtained.

(Modification Example 26)

Not only a silane precursor gas not containing C and nitrogen (N) but also a silane precursor gas containing C and N may be used as the second process gas. For example, an aminosilane precursor gas may be used as the second process gas. Examples of the aminosilane precursor gas may include butylaminosilane (BAS) gas, bis(tertiary-butylamino) silane (BTBAS) gas, dimethylaminosilane (DMAS) gas, bis(dimethylamino)silane (BDMAS) gas, tris(dimethylamino)silane (3DMAS) gas, diethylaminosilane (DEAS) gas, bis(diethylamino)silane (BDEAS) gas, dipropylaminosilane (DPAS) gas, diisopropylaminosilane (DIPAS) gas, and the like. In this modification example, by setting various processing conditions like the processing conditions of the basic sequence shown in FIG. 4, the same effects as those of the basic sequence shown in FIG. 4 can be obtained. Furthermore, according to this modification example, like Modification Example 23, it is possible to dope a small amount of C or the like into the Si film and to obtain the same effects as those of Modification Example 23.

Other Embodiments of the Present Disclosure

The embodiment of the present disclosure has been specifically described above. However, the present disclosure is not limited to the above-described embodiment but may be diversely modified without departing from the spirit of the present disclosure.

For example, in the above-described embodiment, there has been described the case where the Si film forming step and the SiO film forming step are performed in the same process chamber (in-situ). However, the present disclosure is not limited to such an embodiment. That is to say, the Si film forming step and the SiO film forming step may be performed in different process chambers (ex-situ). By performing a series of steps in-situ, it is possible to consistently perform processes while the wafer 200 is kept under vacuum without being exposed to the atmosphere. This makes it possible to stably perform the substrate processing procedure. If some steps are performed ex-situ, the temperatures in the respective process chambers can be preset, for example, at the process temperatures of the respective steps or the temperatures close thereto. This makes it possible to shorten the time required for temperature adjustment and to enhance the production efficiency.

It may be preferred that the recipes used for the substrate processing procedure are individually prepared according to the processing contents and are stored in the memory device 121c via an electric communication line or the external memory device 123. When the process is started, it may be preferred that the CPU 121a appropriately selects a proper recipe from the recipes stored in the memory device 121c according to the contents of the substrate processing procedure. This enables one substrate processing apparatus to form films of different film types, composition ratios, film qualities, and film thicknesses with high reproducibility. Moreover, it is possible to alleviate the burden borne by an operator and to quickly start the process while operation errors are avoided.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described the example in which films are formed using a batch-type substrate processing apparatus capable of processing a plurality of substrates at a time. The present disclosure is not limited to the aforementioned embodiment but may be appropriately applied, for example, to a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be appropriately applied to a case where films are formed using a substrate processing apparatus provided with a cold-wall-type processing furnace.

Figure 7:
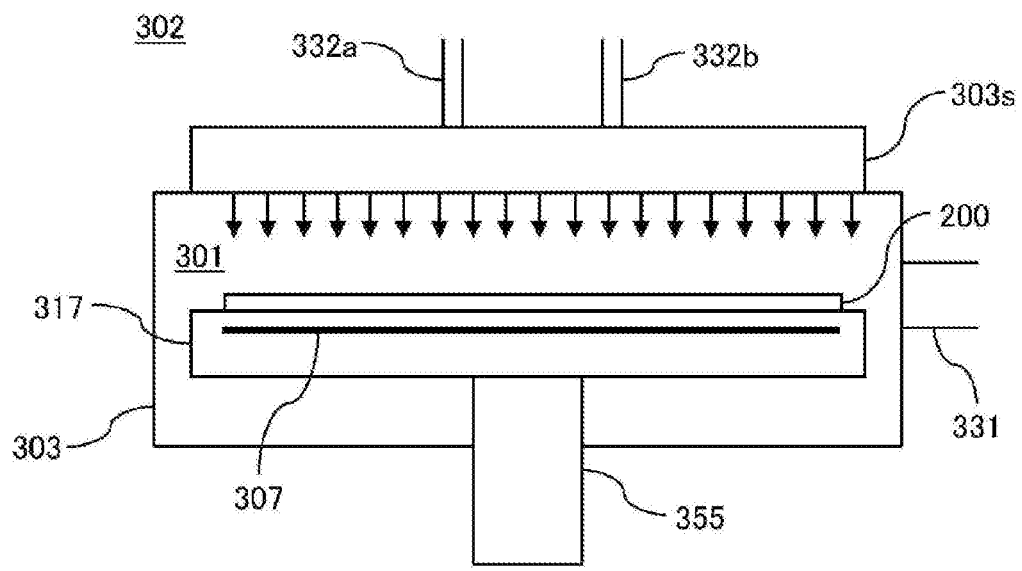
FIG. 7 schematically illustrates a configuration of a vertical processing furnace of a substrate processing apparatus suitably employed in another embodiment of the present disclosure, in which a portion of the processing furnace is shown in a vertical cross-sectional view.

The present disclosure may be suitably applied, for example, to a case where a film is formed using a substrate processing apparatus provided with a processing furnace 302 illustrated in FIG. 7. The processing furnace 302 includes a process vessel 303 which defines a process chamber 301, a shower head 303s as a gas supply part configured to supply gas into the process chamber 301 in a shower-like manner, a support table 317 configured to horizontally support one or more wafers 200, a rotary shaft 355 configured to support the support table 317 from its bottom, and a heater 307 installed in the support table 317. Gas supply ports 332a and 332b are connected to inlets of the shower head 303s. Supply systems similar to the first supply system and the second supply system of the aforementioned embodiment are connected to the gas supply ports 332a and 332b, respectively. A gas distribution plate is installed in outlets of the shower head 303s. The shower head 303s is installed in such a position as to face surfaces of the wafers 200 carried into the process chamber 301. An exhaust port 331 configured to evacuate an interior of the process chamber 301 is installed in the process vessel 303. An exhaust system similar to the exhaust system of the aforementioned embodiment is connected to the exhaust port 331.

Figure 8:
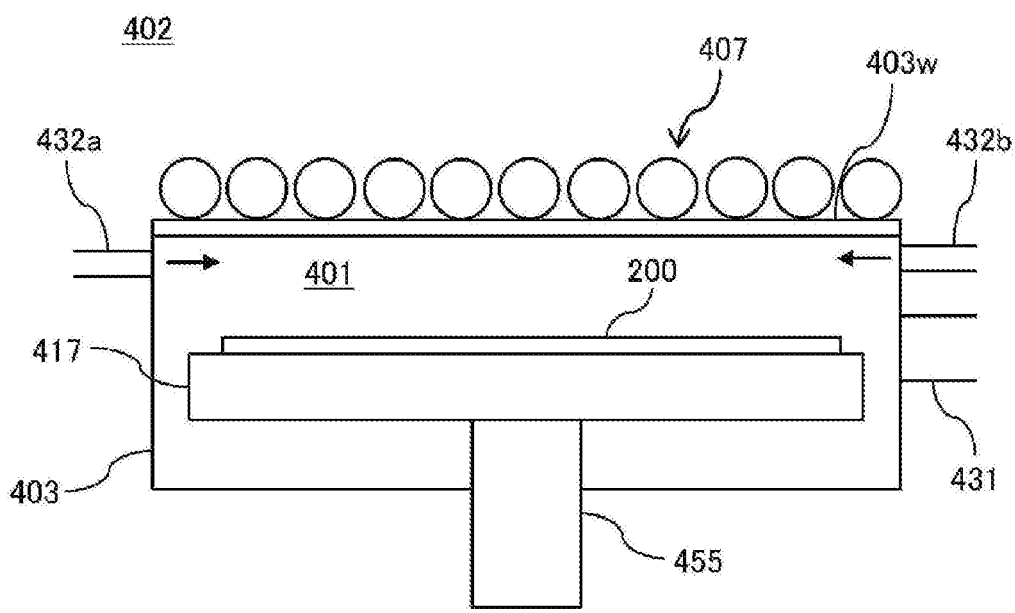
FIG. 8 schematically illustrates a configuration of a vertical processing furnace of a substrate processing apparatus suitably employed in still another embodiment of the present disclosure, in which a portion of the processing furnace is shown in a vertical cross-sectional view.

In addition, the present disclosure may be suitably applied, for example, to a case where a film is formed using a substrate processing apparatus provided with a processing furnace 402 illustrated in FIG. 8. The processing furnace 402 includes a process vessel 403 which defines a process chamber 401, a support table 417 configured to horizontally support one or more wafers 200, a rotary shaft 455 configured to support the support table 417 from its bottom, a lamp heater 407 configured to irradiate light toward the wafers 200 disposed in the process vessel 403, and a quartz window 403w which transmits the light irradiated from the lamp heater 407. Gas supply ports 432a and 432b are connected to the process vessel 403. Supply systems similar to the first supply system and the second supply system of the aforementioned embodiment are connected to the gas supply ports 432a and 432b, respectively. The gas supply ports 432a and 432b are respectively installed at a lateral side of end portions of the wafers 200 carried into the process chamber 401. An exhaust port 431 configured to evacuate an interior of the process chamber 401 is installed in the process vessel 403. An exhaust system similar to the exhaust system of the aforementioned embodiment is connected to the exhaust port 431.

In the case of using these substrate processing apparatuses, film formation may be performed by the sequences and processing conditions similar to those of the embodiment and modification examples described above. Effects similar to those of the embodiment and modification examples described above may be achieved.

The Si film formed by the methods of the above-described embodiments and modification examples may be used as channel Si of a three-dimensional NAND type flash memory (3DNAND), in which case the contact resistance between the wafer and the channel Si can be greatly reduced and the electrical characteristics can be greatly improved.

In the above-described embodiments and modification examples, there has been described the example in which the film containing Si as a main element is formed on the substrate. However, the present disclosure is not limited to such embodiments. That is to say, the present disclosure may be suitably applied to a case where a film containing, in addition to Si, a semimetal element such as germanium (Ge), boron (B), or the like as a main element is formed on a substrate. The present disclosure may also be suitably applied to a case where a film containing, as a main element, a metal element such as titanium (Ti), zirconium (Zr), hafnium (Hf), niobium (Nb), tantalum (Ta), molybdenum (Mo), tungsten (W), yttrium (Y), lanthanum (La), strontium (Sr), aluminum (Al), or the like is formed on a substrate.

According to some embodiments in the present disclosure, it is possible to improve a film quality of a film formed on a substrate.

The above-described embodiments and modification examples may be combined as appropriate. The processing conditions at this time may be, for example, processing conditions similar to those of the above-described embodiments.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising: a process chamber configured to accommodate a substrate; a first supply system configured to supply a halogen-based first process gas, which contains silicon, to the substrate in the process chamber;
a second supply system configured to supply a non-halogen-based second process gas, which contains silicon, to the substrate in the process chamber;
a third supply system configured to supply a hydrogen-containing gas to the substrate in the process chamber; and
a controller configured to control the first supply system, the second supply system, and the third supply system to:
form a film on the substrate by performing a cycle a predetermined number of times, the cycle including alternately performing:
supplying the first process gas to the substrate in the process chamber; and
supplying the second process gas to the substrate in the process chamber,
wherein the cycle further includes supplying the hydrogen-containing gas to the substrate in the process chamber simultaneously with at least one selected from the group of the act of supplying the first process gas and the act of supplying the second process gas, and
wherein the internal pressure of the process chamber in the act of supplying the first process gas is set to be within a range of 400 Pa to 1,000 Pa, and the internal pressure of the process chamber in the act of supplying the second process gas is set to be within a range of 250 Pa to 350 Pa;
wherein a temperature of the substrate in the act of supplying the first process gas and a temperature of the substrate in the act of supplying the second process gas are set to be within a range of 350 to 450 degrees C.; and
wherein the film on the substrate is oxidized over an entire region in a film thickness direction without oxidation of a surface of the substrate.

2. A non-transitory computer-readable recording medium storing a program that causes, by a computer, a substrate processing apparatus to perform a process comprising:
forming a film on a substrate in a process chamber of the substrate processing apparatus by performing a cycle a predetermined number of times, the cycle including alternately performing:
supplying a halogen-based first process gas, which contains silicon, to the substrate in the process chamber; and
supplying a non-halogen-based second process gas, which contains silicon, to the substrate in the process chamber, wherein the cycle further includes supplying a hydrogen-containing gas to the substrate in the process chamber simultaneously with at least one selected from the group of the act of supplying the first process gas and the act of supplying the second process gas, and
wherein the internal pressure of the process chamber in the act of supplying the first process gas is set to be within a range of 400 Pa to 1,000 Pa, and the internal pressure of the process chamber in the act of supplying the second process gas is set to be within a range of 250 Pa to 350 Pa;
wherein a temperature of the substrate in the act of supplying the first process gas and a temperature of the substrate in the act of supplying the second process gas are set to be within a range of 350 to 450 degrees C.; and wherein the film on the substrate is oxidized over an entire region in a film thickness direction without oxidation of a surface of the substrate.

3. The apparatus of claim 1, wherein the first process gas includes at least one selected from the group of chlorosilane gas, fluorosilane gas, bromosilane gas, and iodosilane gas.

4. The apparatus of claim 1, wherein the second process gas includes at least one selected from the group of silicon hydride gas and aminosilane gas.

5. The apparatus of claim 1, wherein the hydrogen-containing gas includes hydrogen gas.

6. The apparatus of claim 1, wherein the film includes an epitaxial silicon film.

7. The recording medium of claim 2, wherein the first process gas includes at least one selected from the group of chlorosilane gas, fluorosilane gas, bromosilane gas, and iodosilane gas.

8. The recording medium of claim 2, wherein the second process gas includes at least one selected from the group of silicon hydride gas and aminosilane gas.

9. The recording medium of claim 2, wherein the hydrogen-containing gas includes hydrogen gas.

10. The recording medium of claim 2, wherein the film includes an epitaxial silicon film.

11. The apparatus of claim 1, further comprising an exhaust system configured to exhaust an interior of the process chamber,
wherein the cycle further includes exhausting the first process gas from the interior of the process chamber, and
wherein the cycle includes a time period in which the act of exhausting the first process gas and the act of supplying the hydrogen-containing gas are simultaneously performed.

12. The apparatus of claim 1, further comprising an exhaust system configured to exhaust an interior of the process chamber,
wherein the cycle further includes exhausting the second process gas from the interior of the process chamber, and
wherein the cycle includes a time period in which the act of exhausting the second process gas and the act of supplying the hydrogen-containing gas are simultaneously performed.

13. The apparatus of claim 1, wherein the hydrogen-containing gas is supplied simultaneously with the first process gas and the second process gas, and a supply flow rate of the hydrogen-containing gas simultaneously supplied with the first process gas is set to be smaller than a supply flow rate of the hydrogen-containing gas simultaneously supplied with the second process gas.

14. The apparatus of claim 1, wherein the hydrogen-containing gas is supplied simultaneously with the first process gas and the second process gas, and a supply flow rate of the hydrogen-containing gas simultaneously supplied with the first process gas is set to be greater than a supply flow rate of the hydrogen-containing gas simultaneously supplied with the second process gas.

15. The recording medium of claim 2, wherein the cycle further includes exhausting the first process gas from the interior of the process chamber, and
wherein the cycle includes a time period in which the act of exhausting the first process gas and the act of supplying the hydrogen-containing gas are simultaneously performed.

16. The recording medium of claim 2, wherein the cycle further includes exhausting the second process gas from the interior of the process chamber, and
wherein the cycle includes a time period in which the act of exhausting the second process gas and the act of supplying the hydrogen-containing gas are simultaneously performed.

17. The recording medium of claim 2, wherein the hydrogen-containing gas is supplied simultaneously with the first process gas and the second process gas, and a supply flow rate of the hydrogen-containing gas simultaneously supplied with the first process gas is set to be smaller than a supply flow rate of the hydrogen-containing gas simultaneously supplied with the second process gas.

18. The recording medium of claim 2, wherein the hydrogen-containing gas is supplied simultaneously with the first process gas and the second process gas, and a supply flow rate of the hydrogen-containing gas simultaneously supplied with the first process gas is set to be greater than a supply flow rate of the hydrogen-containing gas simultaneously supplied with the second process gas.

* * * * *